United States Patent
Saito

(10) Patent No.: US 11,009,925 B2
(45) Date of Patent: May 18, 2021

(54) ELECTRONIC DEVICE FOR LIQUID IMMERSION COOLING

(71) Applicant: ExaScaler Inc., Tokyo (JP)

(72) Inventor: Motoaki Saito, Tokyo (JP)

(73) Assignee: EXASCALER INC., Tokyo (JP)

( * ) Notice: Subject to any disclaimer, the term of this patent is extended or adjusted under 35 U.S.C. 154(b) by 0 days.

(21) Appl. No.: 16/302,580

(22) PCT Filed: May 16, 2016

(86) PCT No.: PCT/JP2016/064535
§ 371 (c)(1),
(2) Date: Nov. 16, 2018

(87) PCT Pub. No.: WO2017/199318
PCT Pub. Date: Nov. 23, 2017

(65) Prior Publication Data
US 2019/0179382 A1    Jun. 13, 2019

(51) Int. Cl.
*G06F 1/20* (2006.01)
*H05K 7/20* (2006.01)
*G06F 1/18* (2006.01)

(52) U.S. Cl.
CPC .......... *G06F 1/20* (2013.01); *G06F 1/18* (2013.01); *G06F 1/182* (2013.01); *G06F 1/183* (2013.01);
(Continued)

(58) Field of Classification Search
CPC . G06F 1/20; G06F 1/182; G06F 1/183; G06F 1/18; G06F 2200/201; H05K 7/20236; H05K 7/20772
See application file for complete search history.

(56) References Cited

U.S. PATENT DOCUMENTS

| 9,723,744 B1* | 8/2017 | Fricker | H05K 7/1492 |
| 2006/0107678 A1* | 5/2006 | Nicolai | H05K 7/20772 62/259.2 |

(Continued)

FOREIGN PATENT DOCUMENTS

| JP | 2008-205402 A | 9/2008 |
| JP | 2008205402 A * | 9/2008 |

(Continued)

OTHER PUBLICATIONS

JP 2008205402 A—Machine Translation (Year: 2019).*
International Search Report for related International Application No. PCT/JP2016/064535, dated Jun. 21, 2016; 4 pages.
ExaScaler Inc., et al.; Press Release; Mar. 31, 2015; Partial translation provided; 7 pages.
Nikkei Electronics,"Innovation of Semiconductor, Cooling, Connection Innovated with the Aim of Exa-class High-Performance Machine—Part I" Jun. 20, 2015, pp. 99-105, 13 pages, No. 1157, Nikkei Business Publications, Inc.; Partial Translation.
(Continued)

*Primary Examiner* — Rockshana D Chowdhury
(74) *Attorney, Agent, or Firm* — Procopio, Cory, Hargreaves & Savitch LLP

(57) ABSTRACT

An electronic device is immersed in a coolant filled in a cooling apparatus, and directly cooled. The electronic device is configured to be housed in a housing part of the cooling apparatus, and includes a base board, storage substrates to be arranged on at least one surface of the base board, a backplane mounted orthogonally onto the one surface of the base board, and flash storage units mounted on the respective storage substrates. The backplane includes a combination of backplane units each including a signal connector and a power connector. The signal connector and the power connector are disposed separately for each of the backplane units. The flash storage units are arranged on a surface parallel to at least one surface of each of the storage substrates so as to be adjacent one another in a width or a length direction of the flash storage unit.

6 Claims, 21 Drawing Sheets

(52) U.S. Cl.
CPC ..... *H05K 7/20236* (2013.01); *H05K 7/20772* (2013.01); *G06F 2200/201* (2013.01)

(56) References Cited

U.S. PATENT DOCUMENTS

| | | | | |
|---|---|---|---|---|
| 2009/0031150 A1* | 1/2009 | Koga | ................... | G06F 1/3203 |
| | | | | 713/300 |
| 2010/0067278 A1* | 3/2010 | Oh | ........................ | G11C 5/02 |
| | | | | 365/51 |
| 2010/0217909 A1* | 8/2010 | Pavol | ................... | G06F 13/409 |
| | | | | 710/301 |
| 2013/0107444 A1* | 5/2013 | Schnell | ............... | H05K 7/1498 |
| | | | | 361/679.33 |
| 2013/0135811 A1 | 5/2013 | Dunwoody et al. | | |
| 2013/0170129 A1 | 7/2013 | Sullivan | | |
| 2014/0216711 A1 | 8/2014 | Shelnutt et al. | | |
| 2014/0218858 A1* | 8/2014 | Shelnutt | ................. | G06F 1/206 |
| | | | | 361/679.31 |

FOREIGN PATENT DOCUMENTS

| | | | |
|---|---|---|---|
| JP | 2015-507233 | A | 3/2015 |
| JP | 2015-76113 | A | 4/2015 |
| JP | 2016-46431 | A | 4/2016 |

OTHER PUBLICATIONS

Decision to Grant a Patent for related JP App No. 2017-541889 dated Oct. 17, 2018, 6 pgs.
International Preliminary Report on Patentability for related PCT App No. PCT/JP2016/064535 dated Nov. 29, 2018, 6 pgs.
Extended European Search Report for related EP App No. 16902338.9 dated Jan. 3, 2020, 15 pgs.

\* cited by examiner (b)    (a)

(a)

(b)

ELECTRONIC DEVICE FOR LIQUID IMMERSION COOLING

CROSS-REFERENCE TO RELATED APPLICATIONS

This application is a U.S. National Stage entry of PCT Application No: PCT/JP2016/064535 filed May 16, 2016, the contents of which are incorporated herein by reference.

TECHNICAL FIELD

The present invention relates to an electronic device. More specifically, the present invention relates to an electronic device immersed in the coolant filled in a cooling apparatus so as to be directly cooled. The electronic device described in the specification is required to exhibit super-high performance and stable operations while generating high heating value such as supercomputer and data center. However, it is not limited to those described above.

BACKGROUND ART

Power consumption is one of the essential factors to determine the performance limit of the recent supercomputer. The importance of study on saving power consumed by the supercomputer has been widely recognized. That is, the speed performance per power consumption (Flops/W) is one of indexes for evaluating the supercomputer. The power for cooling operations accounts for approximately 45% of the power consumption of the entire data center. Reduction in the power consumption by improving cooling efficiency has been increasingly demanded.

Conventionally, the process for cooling the supercomputer and the data center has been performed through two different methods, that is, air cooling method and liquid cooling method. In general, the cooling efficiency of the liquid cooling method is better than that of the air cooling method attributable to superior heat transfer performance to that of air. Especially, in comparison with the liquid immersion cooling system using synthetic oil, the liquid immersion cooling system using fluorocarbon-based coolant has received much attention because of the advantage in regards to the maintenance work for the electronic device (specifically, for example, adjustment, inspection, repair, replacement, extension and the like).

The inventor has already developed the compact liquid immersion cooling apparatus with excellent cooling efficiency suitable for the supercomputer of small-scale liquid immersion cooling type. Such apparatus has been applied to the compact supercomputer "Suiren" installed and operated in the high-energy accelerator research organization (Non-patent Literature 1).

The inventor has also proposed the improved liquid immersion cooling apparatus configured to allow substantial improvement in packaging density of the electronic devices subjected to the liquid immersion cooling (Non-patent Literature 2).

CITATION LIST

Non-Patent Literature 1: "Liquid immersion cooling compact supercomputer "ExaScaler-1" succeeded in measurement of the value corresponding to the world highest level of the latest supercomputer power consumption performance ranking "Green500" resulting from the performance improvement by 25% or higher" Mar. 31, 2015, Press Release, ExaScaler Inc., et al., URL:http://exascaler.co.jp/wp-content/uploads/2015/03/20150331.pdf Non-Patent Literature 2: "Innovation of Semiconductor, Cooling, Connection, Aiming at Exa-grade High-performance Machine—Part I", July 2015 issue of Nikkei Electronics, pp. 99-105, Jun. 20, 2015, published by Nikkei Business Publications, Inc.

SUMMARY OF INVENTION

Technical Problem

There has been required to develop an electronic device applied to the liquid immersion cooling apparatus, which is newly configured to allow a plurality of processors to carry out arithmetic operations as prime objects by installing more units of processors in a limited volume so as to further improve processing capabilities and packaging density.

There has been required to develop an electronic device applied to the liquid immersion cooling apparatus, which is newly configured to mainly serve as a memory using more units of storage devices installed in the limited volume so as to further improve storing capacity and packaging density.

There has been required to develop an electronic device applied to the liquid immersion cooling apparatus, which is newly configured to serve mainly as a memory using a plurality of storage devices so as to further improve packaging density while exhibiting maintainability of the electronic device.

Solution to Problem

For the purpose of solving the above-described problem, according to an aspect of the present invention, the electronic device that is immersed in a coolant filled in a cooling apparatus, and directly cooled includes a first circuit board having one surface on which a plurality of processors and a plurality of main memories are mounted. The processors are arranged on the one surface of the first circuit board in a substrate length direction of the main memory.

According to another aspect of the present invention, the electronic device that is immersed in a coolant filled in a cooling apparatus, and directly cooled includes a plurality of first circuit boards each having one surface on which 4 or more processors and 4 or more main memories are mounted. The 4 or more main memories are arranged to divide the one surface of the first circuit board into at least 2 or more regions in a width direction. At least the 2 or more processors are arranged in a substrate length direction of the main memory in each of the 2 or more regions.

According to another aspect of the present invention, the electronic device that is immersed in a coolant filled in a cooling apparatus, and directly cooled is configured to be housed in a housing part of the cooling apparatus. The electronic device includes a base board, and one or more substrate groups attached to at least one surface of the base board. The one or more substrate groups include one or more first circuit boards each having one surface on which a plurality of processors and a plurality of main memories are mounted, a second circuit board, a connector for electric connection between the one or more first circuit boards and the second circuit board, and a flow channel formed in a gap between a surface opposite the one surface of the one or more first circuit boards, and one surface of the second circuit board while facing the surface opposite the one surface of the one or more first circuit boards. The processors are arranged on the one surface of the first circuit board in a substrate length direction of the main memory.

According to another aspect of the present invention, the electronic device that is immersed in a coolant filled in a cooling apparatus, and directly cooled is configured to be housed in each of a plurality of housing parts of the cooling apparatus. The cooling apparatus includes a cooling tank with an open space defined by a bottom wall and side walls, the arranged housing parts formed by dividing the open space using a plurality of internal partition walls in the cooling tank, and an inflow opening and an outflow opening for the coolant. The inflow opening is formed in a bottom part or a side surface of each of the housing parts, and the outflow opening is formed around a surface of the coolant circulating in the respective housing parts. The electronic device includes a base board, and one or more substrate groups attached to at least one surface of the base board. The one or more substrate groups include one or more first circuit boards, each having one surface on which a plurality of processors and a plurality of main memories are mounted, a second circuit board, a connector for electric connection between the one or more first circuit boards and the second circuit board, and a flow channel formed in a gap between a surface opposite the one surface of the one or more first circuit boards, and one surface of the second circuit board while facing the surface opposite the one surface of the one or more first circuit boards. The processors are arranged on the one surface of the first circuit board in a substrate length direction of the main memory.

In a preferred embodiment of the electronic device according to the aspect of the present invention, a length of each of the processors in the substrate length direction of the main memory may be equal to or less than ½ of the substrate length of the main memory.

In a preferred embodiment of the electronic device according to the aspect of the present invention, each of the processors may be a semiconductor device of system on-chip type design, and each of the main memories may be an ultra-low memory module.

In a preferred embodiment of the electronic device according to the aspect of the present invention further includes a plurality of spacers for holding the gap, and a plurality of screws. Each of the screws may be designed to pierce through the first circuit board, the second circuit board, and the respective spacers for fastening.

In a preferred embodiment of the electronic device according to the aspect of the present invention, the one or more substrate groups are further mounted on a surface opposite the one surface of the base board. An external shape of a connected body of the base board and the substrate groups may be similar to an internal shape of the housing part. The external shape of the connected body may be a rectangular parallelepiped.

According to another aspect of the present invention, the electronic device that is immersed in a coolant filled in a cooling apparatus, and directly cooled is configured to be housed in a housing part of the cooling apparatus. The electronic device includes a base board, and one or more substrate groups attached to at least one surface of the base board. The one or more substrate groups include one or more first circuit boards, each having one surface on which 4 or more processors and 4 or more main memories are mounted, a second circuit board, a connector for electric connection between the one or more first circuit boards and the second circuit board, and a flow channel formed in a gap between a surface opposite the one surface of the one or more first circuit boards, and one surface of the second circuit board while facing the surface opposite the one surface of the one or more first circuit boards. The 4 or more main memories are arranged to divide the one surface of the first circuit board into at least 2 or more regions in a width direction. The at least 2 or more processors are arranged in a substrate length direction of the main memory in each of the 2 or more regions.

According to another aspect of the present invention, the electronic device that is immersed in a coolant filled in a cooling apparatus, and directly cooled is configured to be housed in each of a plurality of housing parts of the cooling apparatus. The cooling apparatus includes a cooling tank with an open space defined by a bottom wall and side walls, the arranged housing parts formed by dividing the open space using a plurality of internal partition walls in the cooling tank, and an inflow opening and an outflow opening for the coolant. The inflow opening is formed in a bottom part or a side surface of each of the housing parts, and the outflow opening is formed around a surface of the coolant circulating in the respective housing parts. The electronic device includes a base board, and one or more substrate groups attached to at least one surface of the base board. The one or more substrate groups include one or more first circuit boards each having one surface on which 4 or more processors and 4 or more main memories are mounted, a second circuit board, a connector for electric connection between the one or more first circuit boards and the second circuit board, and a flow channel formed in a gap between a surface opposite the one surface of the one or more first circuit boards, and one surface of the second circuit board while facing the surface opposite the one surface of the one or more first circuit boards. The processors are arranged on the one surface of the first circuit board in a substrate length direction of the main memory.

In a preferred embodiment of the electronic device according to the aspect of the present invention, a length of each of the 4 or more processors in the substrate length direction of the main memory may be equal to or less than ½ of the substrate length of each of the 4 or more main memories.

In a preferred embodiment of the electronic device according to the aspect of the present invention, each of the 4 or more processors may be a semiconductor device of system on-chip type design, and each of the 4 or more main memories may be an ultra-low memory module.

In a preferred embodiment of the electronic device according to the aspect of the present invention, the electronic device further includes a plurality of spacers for holding the gap, and a plurality of screws. Each of the screws may be designed to pierce through the first circuit board, the second circuit board, and the respective spacers for fastening.

In a preferred embodiment of the electronic device according to the aspect of the present invention, the one or more substrate groups are further mounted on a surface opposite the one surface of the base board. An external shape of a connected body of the base board and the substrate groups may be similar to an internal shape of the housing part. The external shape of the connected body may be a rectangular parallelepiped.

According to another aspect of the present invention, an electronic device that is immersed in a coolant filled in a cooling apparatus, and directly cooled includes a storage substrate, and a plurality of flash storage units which are mounted on the storage substrate. The flash storage units are arranged on a surface parallel to at least one surface of each of the storage substrates so as to be adjacent one another in a width or a length direction, or in both the width and the length directions of the flash storage unit.

According to another aspect of the present invention, an electronic device that is immersed in a coolant filled in a cooling apparatus, and directly cooled is configured to be housed in a housing part of the cooling apparatus. The electronic device includes a base board, a plurality of storage substrates to be arranged on at least one surface of the base board, a backplane including a plurality of connectors for electric connection of the respective storage substrates, which is mounted orthogonally onto the one surface of the base board, and a plurality of flash storage units mounted on the respective storage substrates. The flash storage units are arranged on a surface parallel to at least one surface of each of the storage substrates so as to be adjacent one another in a width or a length direction, or in both the width and the length directions of the flash storage unit.

According to another aspect of the present invention, an electronic device that is immersed in a coolant filled in a cooling apparatus, and directly cooled is configured to be housed in each of a plurality of housing parts of the cooling apparatus. The cooling apparatus includes a cooling tank with an open space defined by a bottom wall and side walls, the arranged housing parts formed by dividing the open space using a plurality of internal partition walls in the cooling tank, and an inflow opening and an outflow opening for the coolant. The inflow opening is formed in a bottom part or a side surface of each of the housing parts, and the outflow opening is formed around a surface of the coolant circulating in the respective housing parts. The electronic device includes a base board, a plurality of storage substrates to be arranged on at least one surface of the base board, a backplane including a plurality of connectors for electric connection of the respective storage substrates, which is mounted orthogonally onto the one surface of the base board, and a plurality of flash storage units mounted on the respective storage substrates. The flash storage units are arranged on a surface parallel to at least one surface of each of the storage substrates so as to be adjacent one another in a width or a length direction, or in both the width and the length directions of the flash storage unit.

In a preferred embodiment of the electronic device according to the aspect of the present invention, the flash storage unit may be an M.2 SSD or an mSATA SSD.

In a preferred embodiment of the electronic device according to the aspect of the present invention, a plurality of flash storage connectors may be arranged on the one surface of the storage substrate so as to allow each electric contact of the flash storage units to be inserted into each of the flash storage connectors.

In a preferred embodiment of the electronic device according to the aspect of the present invention, the base board may be configured to include a primary member and a secondary member. The primary member may be designed to include a plurality of cuts each formed in a width direction for fixing a plurality of support plates that support the storage substrates to the primary member, and the secondary member may be designed to include a plurality of pawls which are inserted into a plurality of slits formed in the backplane, respectively, and fixed to the primary member. The support plates may be designed to include holes for passage of the coolant.

In a preferred embodiment of the electronic device according to the aspect of the present invention, the storage substrates are further arranged on a surface opposite the one surface of the base board. The backplane further includes a plurality of connectors for electric connection of the storage substrates arranged on the surface opposite the one surface of the base board. An external shape of a connected body formed by attaching the storage substrates and the backplane to the base board may be similar to an internal shape of the housing part. The external shape of the connected body may be a rectangular parallelepiped.

According to another aspect of the present invention, an electronic device that is immersed in a coolant filled in a cooling apparatus, and directly cooled is configured to be housed in a housing part of the cooling apparatus. The electronic device includes a base board, a plurality of storage substrates to be arranged on at least one surface of the base board, a backplane including a plurality of connectors for electric connection of the respective storage substrates, which is mounted orthogonally onto the one surface of the base board, and a plurality of flash storage units mounted on the respective storage substrates. The backplane includes a combination of a plurality of backplane units arranged in a length direction of the base board. Each of the backplane units includes a signal connector and a power connector, both of which are disposed separately for each of the backplane units. The flash storage units are arranged on a surface parallel to at least one surface of each of the storage substrates so as to be adjacent one another in a width or a length direction, or in both the width and the length directions of the flash storage unit.

According to another aspect of the present invention, an electronic device that is immersed in a coolant filled in a cooling apparatus, and directly cooled is configured to be housed in each of a plurality of housing parts of the cooling apparatus. The cooling apparatus includes a cooling tank with an open space defined by a bottom wall and side walls, the arranged housing parts formed by dividing the open space using a plurality of internal partition walls in the cooling tank, and an inflow opening and an outflow opening for the coolant. The inflow opening is formed in a bottom part or a side surface of each of the housing parts, and the outflow opening is formed around a surface of the coolant circulating in the respective housing parts. The electronic device includes a base board, a plurality of storage substrates to be arranged on at least one surface of the base board, a backplane including a plurality of connectors for electric connection of the respective storage substrates, which is mounted orthogonally onto the one surface of the baseboard, a plurality of flash storage units mounted on the respective storage substrates. The backplane includes a combination of a plurality of backplane units arranged in a length direction of the base board. Each of the backplane units includes a signal connector and a power connector, both of which are disposed separately for each of the backplane units. The flash storage units are arranged on a surface parallel to at least one surface of each of the storage substrates so as to be adjacent one another in a width or a length direction, or in both the width and the length directions of the flash storage unit.

According to another aspect of the present invention, the electronic device that is immersed in a coolant filled in a cooling apparatus, and directly cooled includes a storage substrate, and a plurality of flash storage units which are mounted on the storage substrate. The flash storage units are arranged on a plurality of surfaces parallel to at least one surface of each of the storage substrates so as to be adjacent one another in a width or a length direction, or in both the width and the length directions of the flash storage unit.

According to another aspect of the present invention, the electronic device that is immersed in a coolant filled in a cooling apparatus, and directly cooled is configured to be housed in a housing part of the cooling apparatus. The electronic device includes a base board, a plurality of storage substrates to be arranged on at least one surface of the base board, a backplane including a plurality of connectors for electric connection of the respective storage substrates, which is mounted orthogonally onto the one surface of the base board, and a plurality of flash storage units mounted on the respective storage substrates. The flash storage units are arranged on a plurality of surfaces parallel to at least one surface of each of the storage substrates so as to be adjacent one another in a width or a length direction, or in both the width and the length directions of the flash storage unit.

According to another aspect of the present invention, the electronic device that is immersed in a coolant filled in a cooling apparatus, and directly cooled is configured to be housed in each of a plurality of housing parts of the cooling apparatus. The cooling apparatus includes a cooling tank with an open space defined by a bottom wall and side walls, the arranged housing parts formed by dividing the open space using a plurality of internal partition walls in the cooling tank, and an inflow opening and an outflow opening for the coolant. The inflow opening is formed in a bottom part or a side surface of each of the housing parts, and the outflow opening is formed around a surface of the coolant circulating in the respective housing parts. The electronic device includes a base board, a plurality of storage substrates to be arranged on at least one surface of the base board, a backplane including a plurality of connectors for electric connection of the respective storage substrates, which is mounted orthogonally onto the one surface of the base board, and a plurality of flash storage units mounted on the respective storage substrates. The flash storage units are arranged on a plurality of surfaces parallel to at least one surface of each of the storage substrates so as to be adjacent one another in a width or a length direction, or in both the width and the length directions of the flash storage unit.

In a preferred embodiment of the electronic device according to the aspect of the present invention, a plurality of flash storage connectors are arranged on the one surface of the storage substrate. The flash storage connectors facing each other may be different in height. Each electric contact of the flash storage units may be inserted into each of the flash storage connectors.

The cooling tank having the "open space" described in the specification includes the cooling tank with a simple sealing structure sufficient to secure maintainability of the electronic device. The simple sealing structure refers to the one that allows the top plate for closing the open space of the cooling tank to be disposed on the opening of the cooling tank, or the one that allows the top plate to be detachably mounted via the packing or the like.

The above-described and other objects and advantages will be clearly understood in reference to the following explanations of the embodiments. It is to be understood that the embodiments are described for exemplifying purposes, and therefore, the present invention is not limited to those described herein.

DESCRIPTION OF EMBODIMENTS

Figure 1:
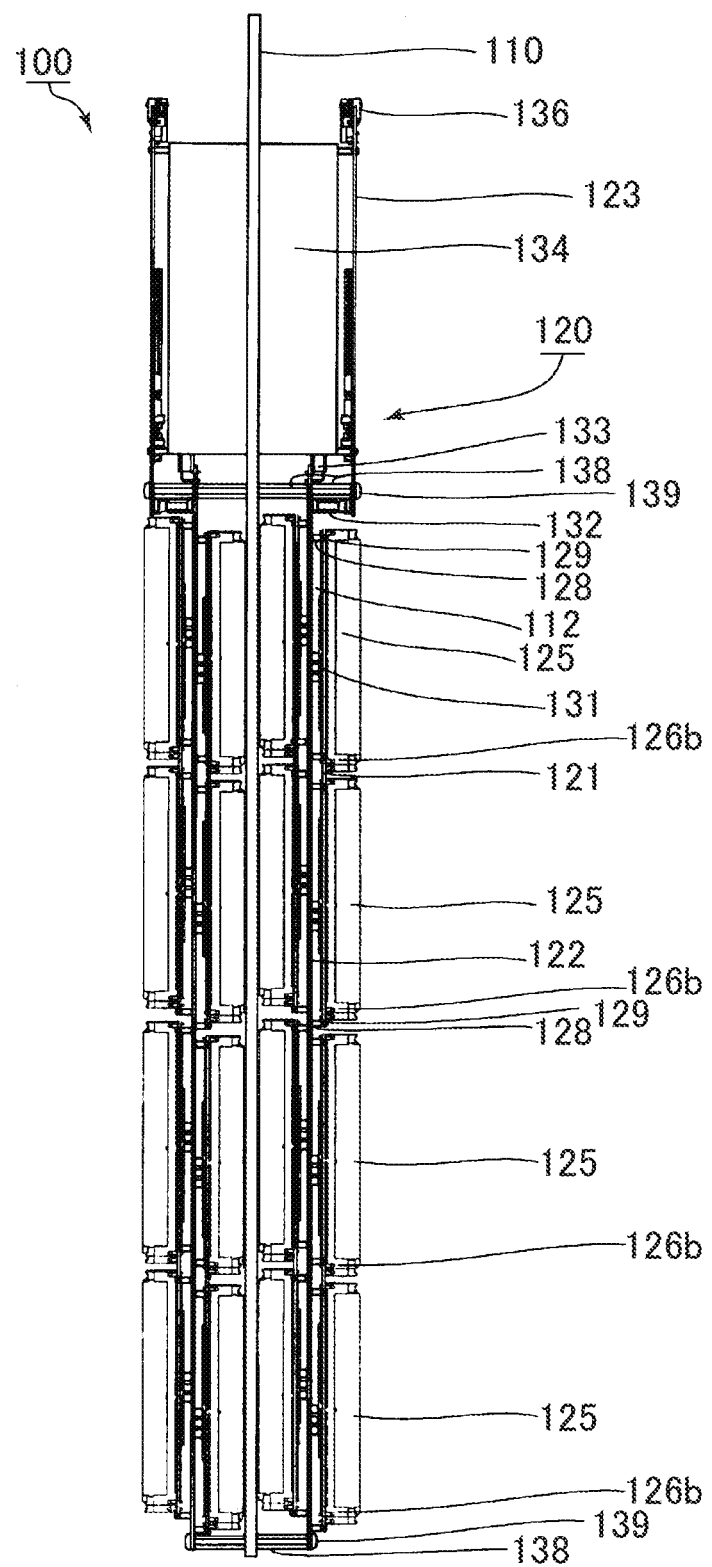
FIG. 1 is a front view of an electronic device according to an embodiment of the present invention.

Preferred embodiments of the electronic device according to the present invention will be described in detail referring to the drawings.

Figure 2:
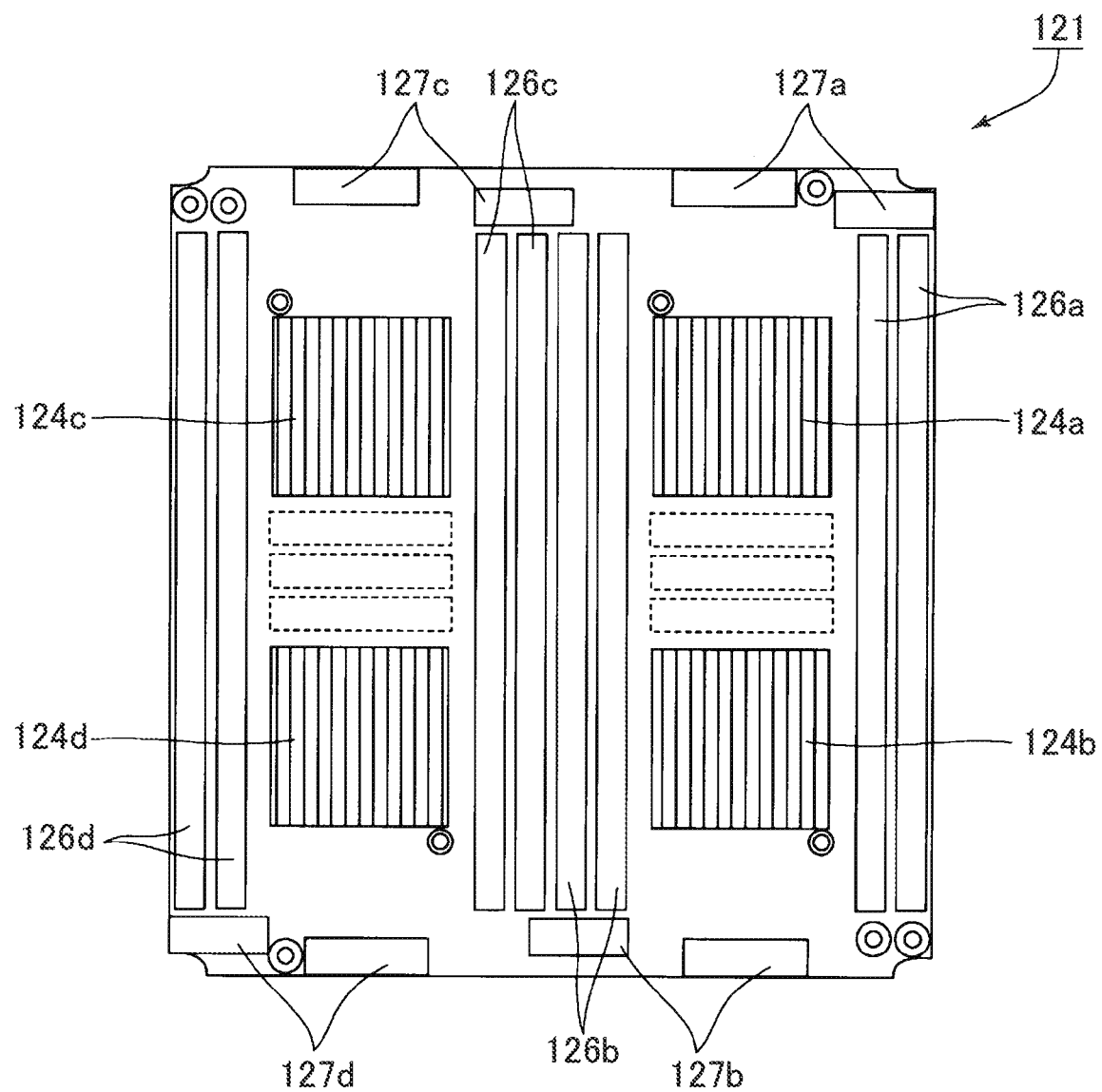
FIG. 2 is a plan view of a multiprocessor substrate installed in the electronic device according to the embodiment of the present invention.
Figure 3:
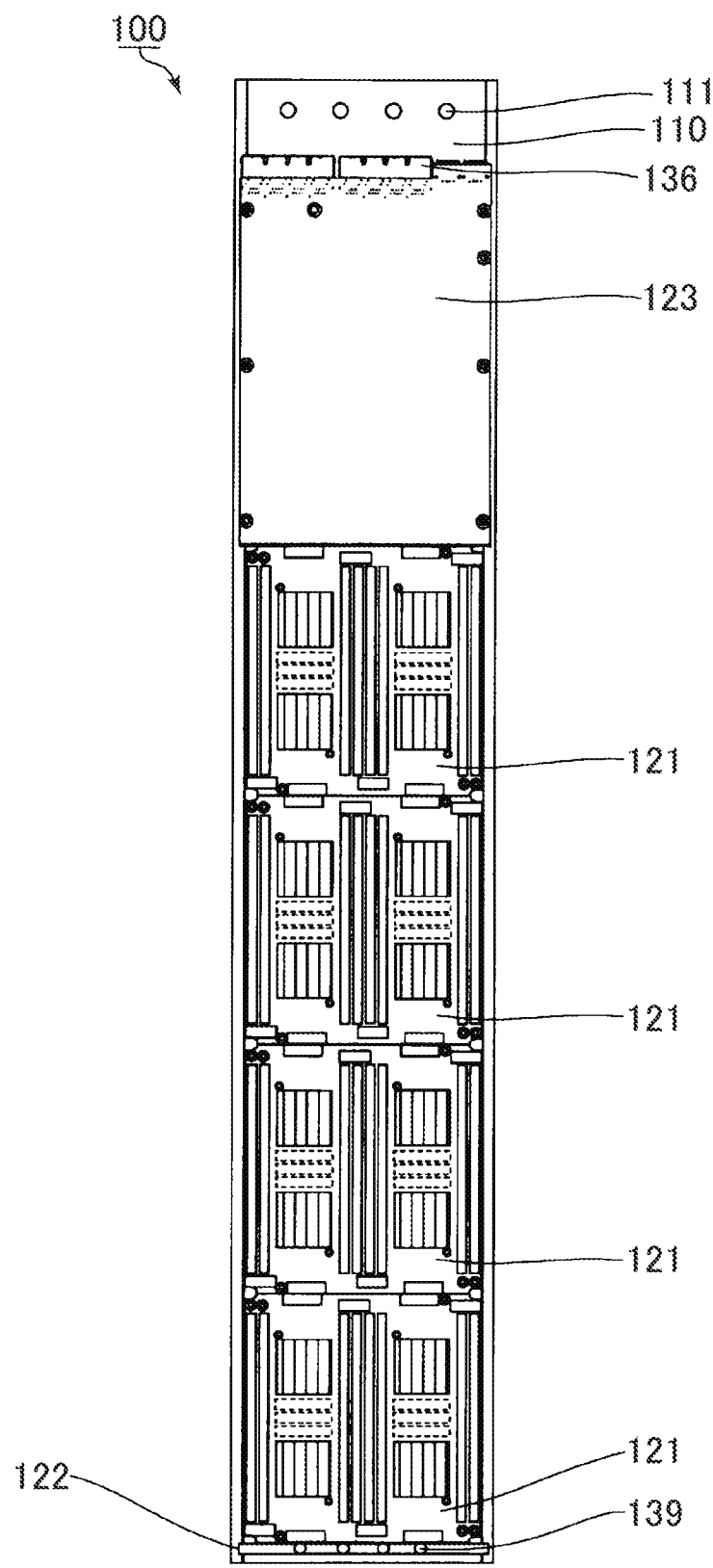
FIG. 3 is a side view of the electronic device according to the embodiment of the present invention.
Figure 4:
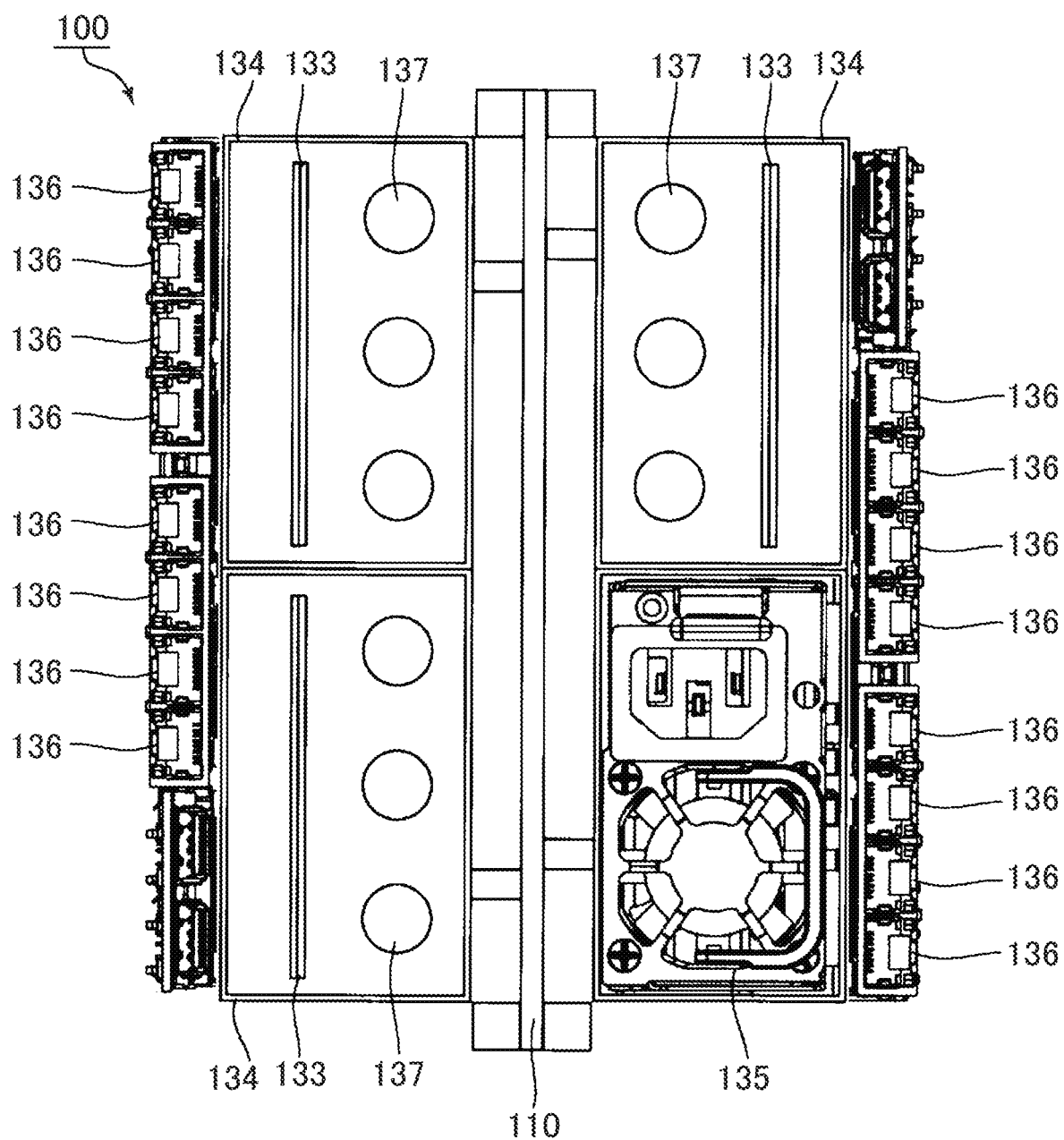
FIG. 4 is a plan view of the electronic device according to the embodiment of the present invention.

Referring to FIGS. 1 to 4, an electronic device 100 according to an embodiment of the present invention will be described. FIG. 1 is a front view of the electronic device 100 according to the embodiment of the present invention. FIG. 3 is a side view, and FIG. 4 is a plan view of the electronic device. The electronic device 100 is immersed in the coolant filled in a cooling apparatus to be described later so as to be directly cooled. It is configured to be housed in each of a plurality of housing parts of the cooling apparatus. The electronic device 100 includes a base board 110 that is retained with a pair of board retainers to be described later, and a substrate group 120 attached to a first surface of the base board 110, and a second surface opposite the first surface, respectively.

In the illustrated example, the substrate group 120 constitutes 4 first circuit boards 121. Each of the first circuit boards 121 includes 4 processors 124*a*, 124*b*, 124*c*, 124*d*, and 8 sockets 126*a*, 126*b*, 126*c*, 126*d* for main memories, which are mounted on one surface of the first circuit board 121 as FIG. 2 shows. Each of the main memories 125 has its electric contact inserted into the corresponding socket so that the memory is mounted on one surface of the first circuit board 121. In this case, 8 sockets for the main memories are arranged as shown in FIG. 2 so that the main memories 125 are arranged to partition the one surface of the first circuit board 121 into two regions in a width direction. In each of the 2 regions, 2 processors (processors 124*a*, 124*b* are disposed on the first region, and processors 124*c*, 124*d* are disposed on the second region) are arranged in the substrate length direction of the substrate on a main memory 125. The number of the regions may be set to the value equal to 2 or more. Preferably, the length of the processor in the direction of the substrate length of the main memory is set to be equal to or less than ½ of the substrate length of the main memory. For example, the semiconductor device of system on-chip type design (for example, Intel Xeon processor D product family of Intel Corporation) may be employed for the processor. The use of the ultra-low memory module (for example, general purpose 326B DDR4 (Double-Data-Rate4) VLP DIMM (very low profile Dual Inline Memory Module) as the main memory makes it possible to actualize the above-described layout of the semiconductor device.

The main memory 125 will be inserted into the 2 sockets 126*a* adjacent to the processor 124*a*, and are associated with the processor 124*a* through communication via a bus. The above-described correlation applies to those between the other processors 124*b*, 124*c*, 124*d* and the main memories 125 to be inserted into the other sockets 126*b*, 126*c*, 126*d* which are adjacent to those processors, respectively. Power from a power unit to be described later is supplied to those processors and the main memories through voltage conversion circuits (DC/DC converter) 127*a*, 127*b*, 127*c*, 127*d*. Each number of the first circuit boards 121 of the substrate group 120, the processors 124*a*, 124*b*, 124*c*, 124*d* of the respective first circuit boards, and the main memories 125 is set for exemplifying purpose. Especially, each number of the processors and the main memories may be set to 4 or more.

The substrate group 120 further includes second circuit boards 122. The second circuit board 122 performs signal transmission between the first circuit board 121 and a third circuit board to be described later, and distribution of a DC power supply from a power unit 135 to be described later to the respective first circuit boards. The component of the second circuit board 122 may include the PCI Express bus, and the bus switch unit.

The second circuit board 122 includes a first connector 131 for electrically connecting the first circuit board 121 and the second circuit board 122, and a flow channel 112 formed in a gap between the surface opposite the one surface of the first circuit substrate 121 and one surface of the second circuit board 122, which faces the surface opposite the first circuit substrate. The substrate group 120 includes a plurality of spacers 128 for retaining the gap, and a plurality of screws 129. Each of the screws 129 pierces through the first circuit board 121, the second circuit board 122, and the spacers 128, respectively for fastening.

The above-structured first circuit board 121 on which the processors 124*a*, 124*b*, 124*c*, 124*d*, and the main memories 125 are mounted may be detachably attached to the second circuit board 122. It is possible to subject the first circuit board 121 including the processors 124*a*, 124*b*, 124*c*, 124*d*, and the main memories 125 to adjustment, inspection, repair, replacement, extension, and the like separately from the second circuit board 122, resulting in significantly improved maintainability.

In the embodiment, the main memories 125 are arranged so as to divide the one surface of the first circuit board 121 into 2 regions in the width direction. Two processors for each of the 2 regions (processors 124*a*, 124*b* for the first region, processors 124*c*, 124*d* for the second region) are arranged in the substrate length direction of the main memory 125 so that the coolant circulating in the regions divided by the main memories 125 takes heat from the respective surfaces of the arranged processors 124*a*, 124*b*, 124*c*, 124*d* immediately and efficiently. It is possible to thermally connect the heat radiation member (for example, heat sink) to the surfaces of the respective processors 124*a*, 124*b*, 124*c*, 124*d* for the purpose of improving the cooling efficiency of the processor.

The flow channel 112 between the first circuit board 121 and the second circuit board 122 allows the coolant circulating through the flow channel 112 to take heat immediately and efficiently from the back surface of the first circuit board 121 on which the processors are installed, resulting in improved cooling efficiency. In the generally employed apparatus of air-cooled type, the device layout of the processors as shown in FIG. 2 cannot be realized. In the embodiment, the use of the above-described heat taking function of the circulating coolant results in the significantly excellent cooling efficiency of the processors. Therefore, even if 4 or more processors are installed in the relatively narrow region with high density, stable operations of the processors and the electronic device 100 are secured. In accordance with the structure of the electronic device 100 according to the embodiment, the processor of system on-chip type design (16 cores) of Intel Xeon processor D product family produced by Intel Corporation, and 2 units of general purpose 32 GB DDR4 VLP DIMM are combined into 1 set. The first circuit board is constituted by the thus structured 4 sets. The controller of Intel Ethernet (trademark) multi-host controller FM1000 family is operated for connecting 16 units of the first circuit boards. This makes it possible to realize ultra-high density mount of 1024 processors (16,384 cores) for the single unit of the electronic device 100.

In the embodiment, each of the first circuit boards 121 includes 4 processors 124*a*, 124*b*, 124*c*, 124*d* which are mounted on one surface of the first circuit board 121 as well as 8 sockets 126*a*, 126*b*, 126*c*, 126*d* for the main memory. The first circuit board 121 may be configured into a minimum structure which includes 2 processors and a plurality of main memories disposed at both sides of the processors so that the 2 processors are arranged in the substrate length direction of the main memory. The length of each of the processors in the substrate length direction of the main memory is set to be equal to or less than ½ of the substrate length of the main memory. The above-described structure allows the coolant circulating in the regions divided with the main memories to take heat from the respective surfaces of the 2 arranged processors immediately and efficiently.

In the case that the single substrate group 120 is disposed on the first surface and the second surface of the base board 110 of the electronic device 100, respectively, it is preferable to make the external shape of a connected body of the base board 110 and the 2 substrate groups 120 similar to the internal shape of each of the housing parts of the cooling apparatus to be described below. Preferably, the external shape of the connected body is a rectangular parallelepiped, for example, as shown in the drawing.

Referring to the illustrated example, each of the substrate groups 120 includes a third circuit board 123. The third circuit board 123 includes 4 network controller chips (not shown), and 8 network cable sockets 136, corresponding to the 4 first circuit boards 121, respectively. A second connector 132 serves to electrically connect the second circuit board 122 and the third circuit board 123.

Referring to the illustrated example, 2 slots 134 are attached to the first surface, and the second surface opposite the first surface of the base board 110, respectively above the substrate group 120 parallel to the base board 110. As FIG. 4 shows, each of the 4 slots 134 is configured to house the power unit 135. The third circuit board 123 is fixed to the base board 110 using a screw 139 piercing through 2 spacers 138 and the second circuit board 122 so that the 2 slots 134 parallel to each other are interposed between the third circuit board 123 and the base board 110. Eight network cable sockets 136 are disposed in parallel on one side of the third circuit board 123 at each opening side of the 2 slots 134.

A socket of the third connector 133 for electrically connecting the power unit 135 and the second circuit board 122 is formed in the bottom of each slot. Three bottom holes 137 through which the coolant passes are formed in the bottom of each slot for immediately and efficiently taking heat from the power unit 135.

In this way, the base board 110 is combined with the third circuit board 123 having 4 network controller chips (not shown) corresponding to the 4 first circuit boards 121, respectively, and 8 network cable sockets arranged on one side parallel to one another. The combination allows arrangement of the 2 slots 134 for the power unit 135 between the third circuit board 123 and the base board 110 at the position that cannot be obstructed by the network cable sockets 136. Conventionally, as the number of the first circuit boards 121 as the CPU units becomes large, it becomes more difficult to secure the space for accommodating 2 or more power units 135 because of increase in the network cable sockets. The use of the above-described arrangement according to the embodiment ensures to solve the problem. That is, it is possible to impart redundancy of the power unit 135 for each of the substrate groups 120.

Figure 5:
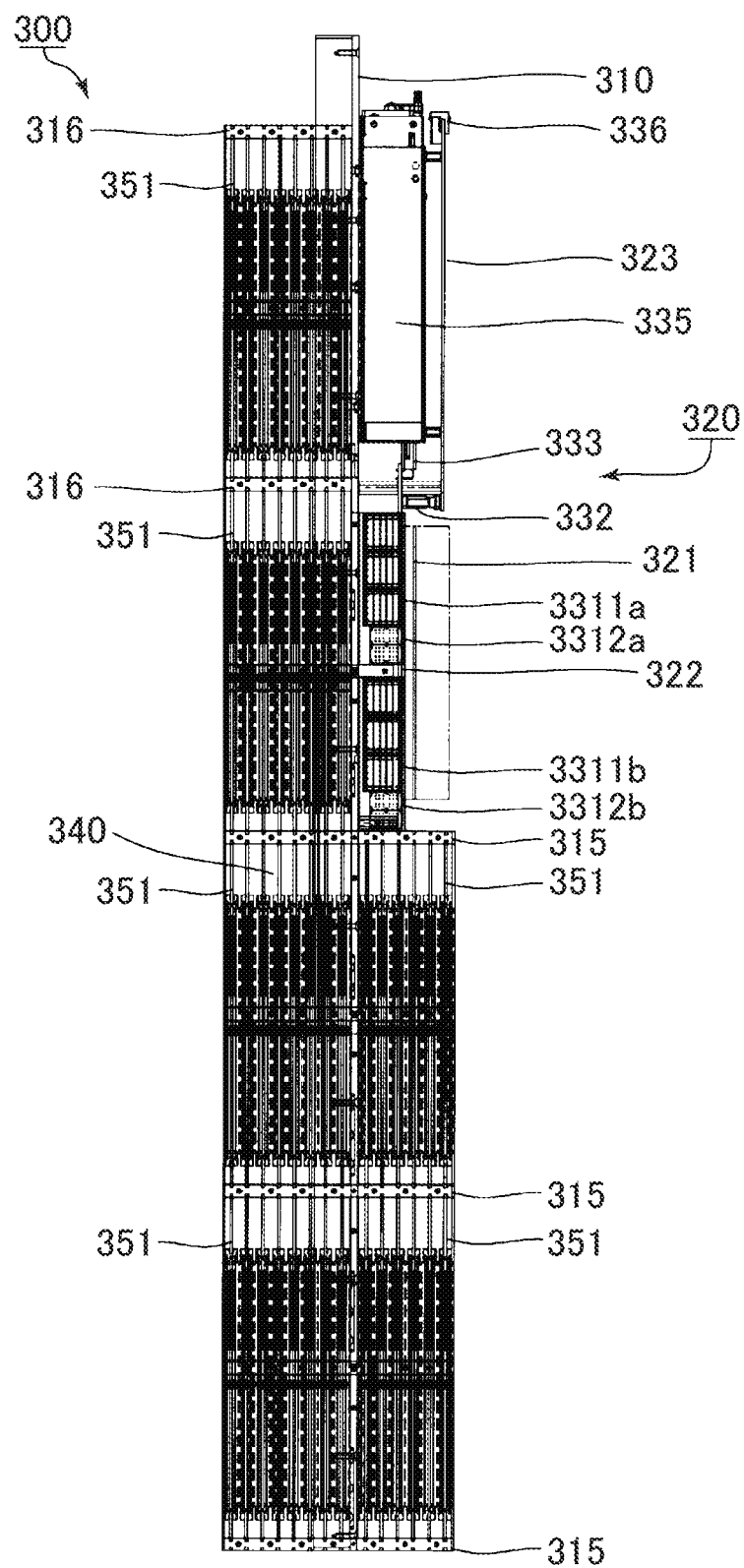
FIG. 5 is a front view of the electronic device according to another embodiment of the present invention.
Figure 6A:
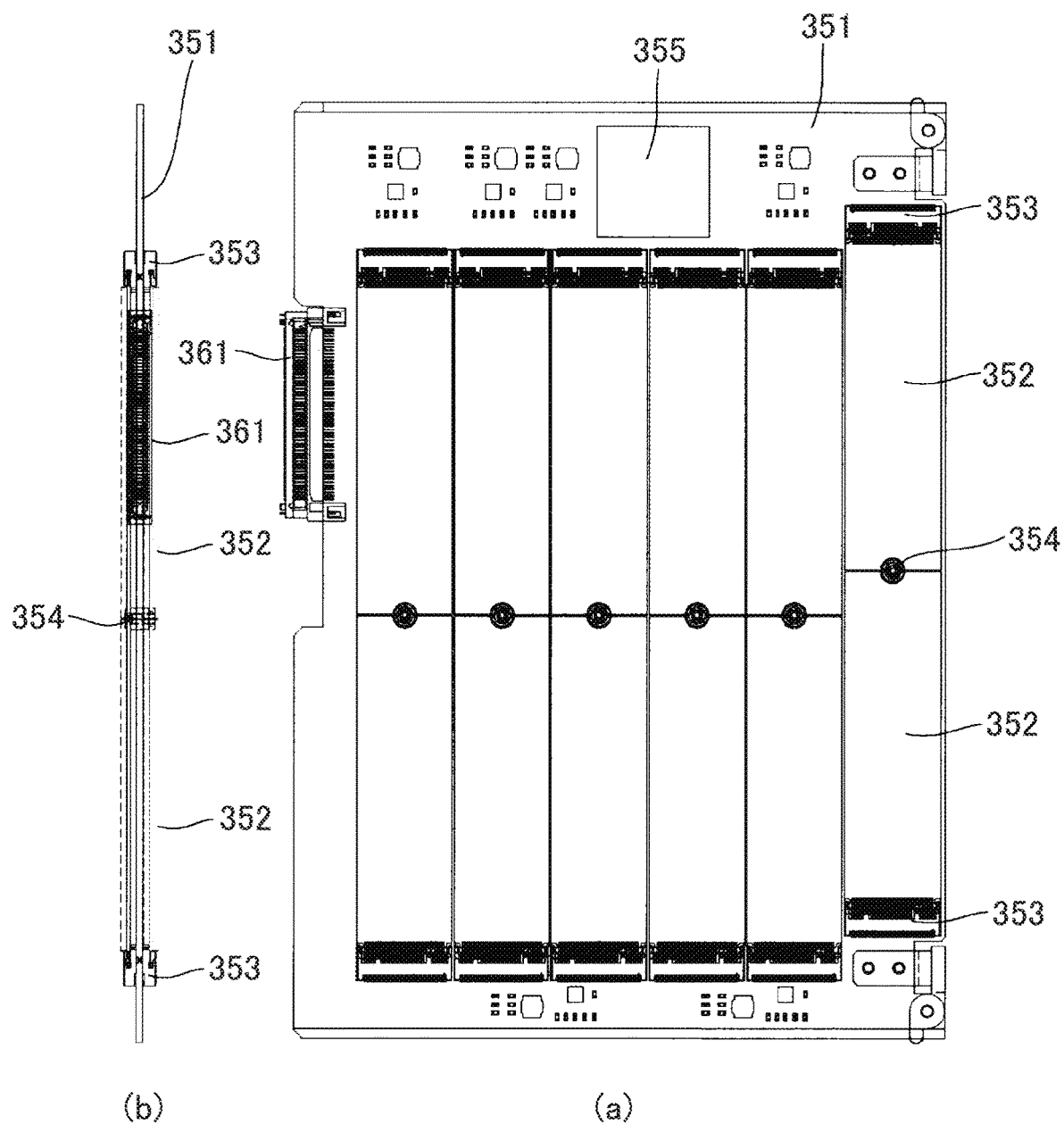
FIG. 6A shows an example of a storage substrate contained in the electronic device according to another embodiment of the present invention, while showing (a) as a plan view and (b) as a sectional view.
Figure 6B:
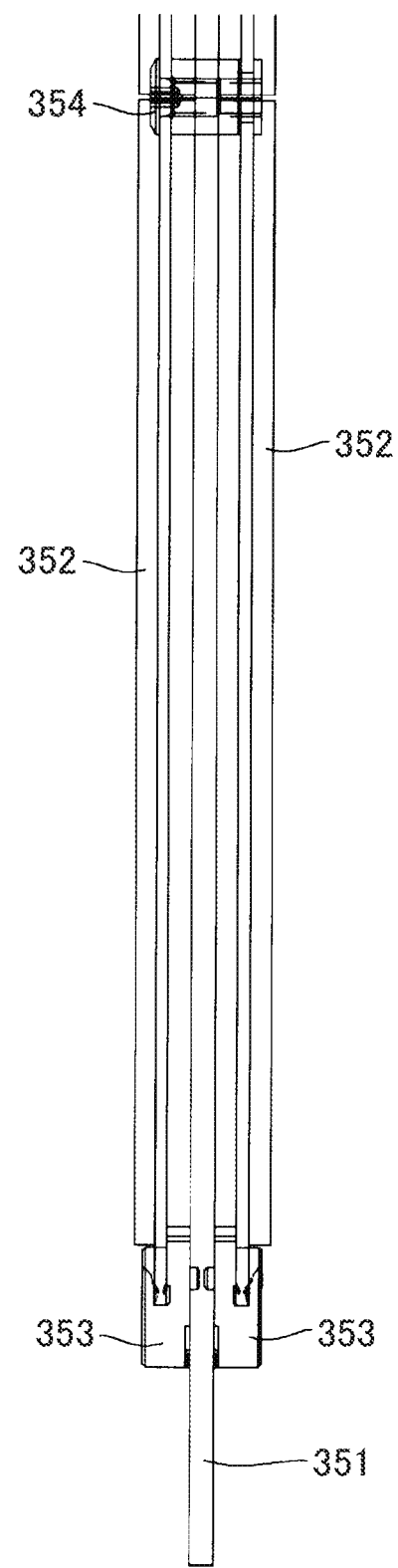
FIG. 6B is a partially enlarged sectional view of an example of the storage substrate contained in the electronic device according to another embodiment of the present invention.
Figure 7:
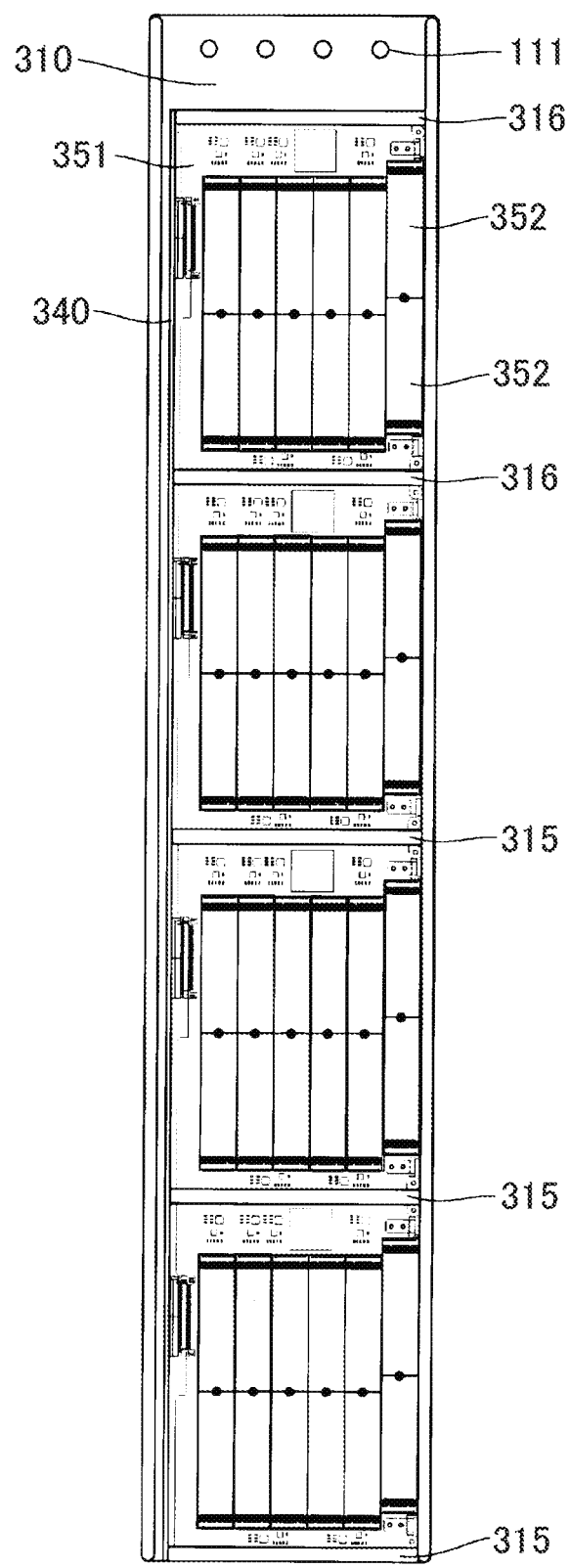
FIG. 7 is a side view of the electronic device according to another embodiment of the present invention.
Figure 8:
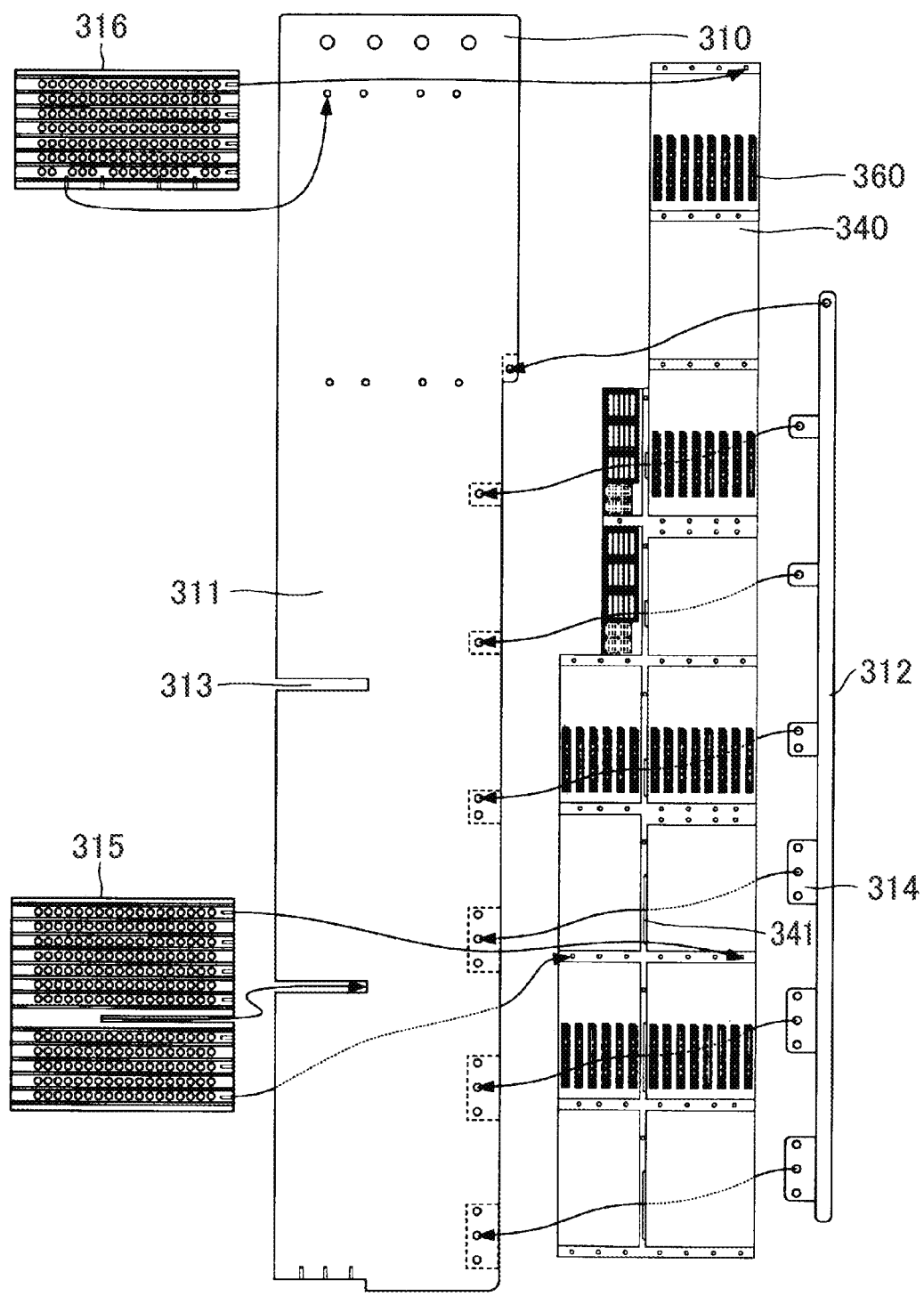
FIG. 8 is a partial assembly diagram of the electronic device according to another embodiment of the present invention.

An electronic device 300 according to another embodiment of the present invention will be described referring to FIGS. 5 to 8. FIG. 5 is a front view of the electronic device 300 according to another embodiment of the present invention. FIG. 7 is a side view, and FIG. 8 is a partial assembly diagram. FIG. 6A shows an example of a storage substrate of the electronic device 300, while showing (a) as a plan view and (b) as a sectional view. FIG. 6B is a partially enlarged view. The electronic device 300 is immersed in the coolant filled in a cooling apparatus to be described later so as to be directly cooled. It is configured to be housed in each of a plurality of housing parts of the cooling apparatus.

The electronic device 300 includes a base board 310 that is retained with a pair of board retainers provided for the housing part to be described later, and a plurality of storage substrates 351 which are disposed on the first surface of the base board 310, and the second surface opposite the first surface, respectively. Referring to the illustrated example, 12 storage substrates 351 are disposed on the first surface, and 32 storage substrates 351 are disposed on the second surface.

Likewise the electronic device 100 as shown in FIGS. 1 to 4, the electronic device 300 includes one or more substrate groups 320, each including a first circuit board 321, a second circuit board 322, and a third circuit board 323. Structures of the first circuit board 321, and the third circuit board 323 are similar to those of the first circuit board 121 and the third circuit board 123 of the electronic device 100 as shown in FIGS. 1 to 4, respectively except the following points. That is, the second circuit board 322 includes a set of signal connector 3311a and power connector 3312a, and a set of signal connector 3311b and power connector 3312b. Signals are transmitted between the third circuit board 323 and a backplane to be described later. The DC power is distributed from the power unit 335 to the backplane. Furthermore, structures of the processor (not shown), the main memory (not shown), the sockets (not shown), the power units 335 (2 sets), and the network cable sockets 336 (2 sets) are also similar to those of the electronic device 100, respectively. Accordingly, detailed explanations of those structures will be omitted.

In view of high-density mount of flash storage units, the embodiment is characterized by arrangement of the flash storage units mounted on the storage substrate as shown in FIGS. 6A, 6B, and 7.

FIG. 6A is a view showing an example of the storage substrate, while showing (a) as a plan view and (b) as a sectional view. Referring to FIG. 6A, the storage substrate 351 includes 12 flash storage units 352 on both surfaces, respectively, resulting in 24 (12×2) flash storage units 352. Especially in the embodiment, a plurality of flash storage connectors 353 are disposed on one surface and a surface opposite the one surface, respectively. The electric contacts each provided at one end of the flash storage unit 352 are inserted into the flash storage connector 353 so that 12 flash storage units 352 are arranged on the surface parallel to the one surface of the storage substrate 351, and on the surface parallel to the surface opposite the one surface, while being adjacent one another in the width direction or the length direction of the flash storage unit 352. The other end of each of the flash storage units 352 is fixed with a fastener 354. The above-described structure provides an extremely thin storage substrate 351 having 24 flash storage units mounted with high density. In addition to a RAID controller (not shown), an expander 355 (for example, SAS (Serial Attached SCSI) expander, SATA (Serial ATA) expander, PCI express expander) is mounted on the storage substrate 351 for securing connection to 24 flash storage units.

It is possible to use an M.2 SSD (Solid State Drive) or an mSATA SSD as the flash storage unit, but not limited thereto. It is possible to mount the flash storage unit while having the chip surface exposed, without requiring covering with a casing or the like. For example, the use of the SSD of M.2 2280 with thickness of 3.6 mm may actualize the card with thickness of 8.6 mm.

In view of implementing high-density mount of the flash storage substrates 351, the embodiment is characterized by the backplanes 340 each having a plurality of storage connectors 360 for electrically connecting the respective storage substrates 351, which are disposed on the first surface of the base board 310, and the second surface opposite the first surface in the direction orthogonal thereto as shown in FIG. 8.

The base board 310 includes a primary member 311 and a secondary member 312. The primary member 311 includes a plurality of cuts 313 each formed in the width direction for fixing a plurality of support plates 315 that support the respective storage substrates to the primary member 311.

Meanwhile, the secondary member 312 includes a plurality of pawls 314 which are inserted into a plurality of slits 341 formed in the backplane 340, respectively, and fixed to the primary member 311. The support plates 315, 316 include holes for passage of the coolant. In the illustrated example, there are 3 support plates 315 each having 8 grooves, and there are 2 support plates 316 each having 14 grooves so that the maximum of 44 (8×2+14×2) storage substrates 351 may be disposed. In addition to the RAID controller (not shown), the expander (for example, not shown SAS expander) is mounted on the backplane 340 for connection to the maximum of 44 storage substrates.

Upon attachment of the storage substrates 351, the backplane 340, and the substrate group 320 to the base board 310, the external shape of a connected body of the base board 310, the storage substrates 351, the backplane 340, and the substrate group 320 may be similar to each internal shape of the respective housing parts. The external shape of the connected body may be a rectangular parallelepiped as shown in FIG. 7.

When the above-structured electronic device 300 is immersed in the coolant filled in the cooling apparatus so as to be directly cooled, the coolant circulating in the electronic device immediately and efficiently takes heat from the device on the storage substrate 351 (flash storage unit, expander, and the like), the device on the backplane 340 (expander, and the like), the device on the substrate group 320 (processor, network switch, and the like), and the power unit. Accordingly, it is possible to secure stable operations of the flash storage unit, the expander, and the electronic device 300 in spite of the high density mount. The respective storage substrates 351 may be detachably mounted onto the backplane 340. The respective flash storage units 352 may also be detachably mounted onto the storage substrates 351. It is possible to perform adjustment, inspection, repair, replacement, extension and the like for each of the flash storage units 352, or for each of the storage substrates 351 separately, resulting in significantly improved maintainability.

Referring to an example shown in FIG. 8, the backplane 340 is provided as the single substrate. However, it is not easy to manufacture such long substrate including the wiring between the storage connector 360 and the signal connectors 3311*a*, 3311*b*, and the wiring between the storage connector 360 and the power connectors 3312*a*, 3312*b*. Furthermore, quality of such product as well as durability cannot be secured, resulting in the problem of cost increase. In order to solve the above-described problem, the backplane is constituted by combining a plurality of backplane units to be arranged in the longitudinal direction of the base board. Each of the backplane units may have both the signal connector and the power connector so as to be provided separately for each of the backplane units.

Figure 9:
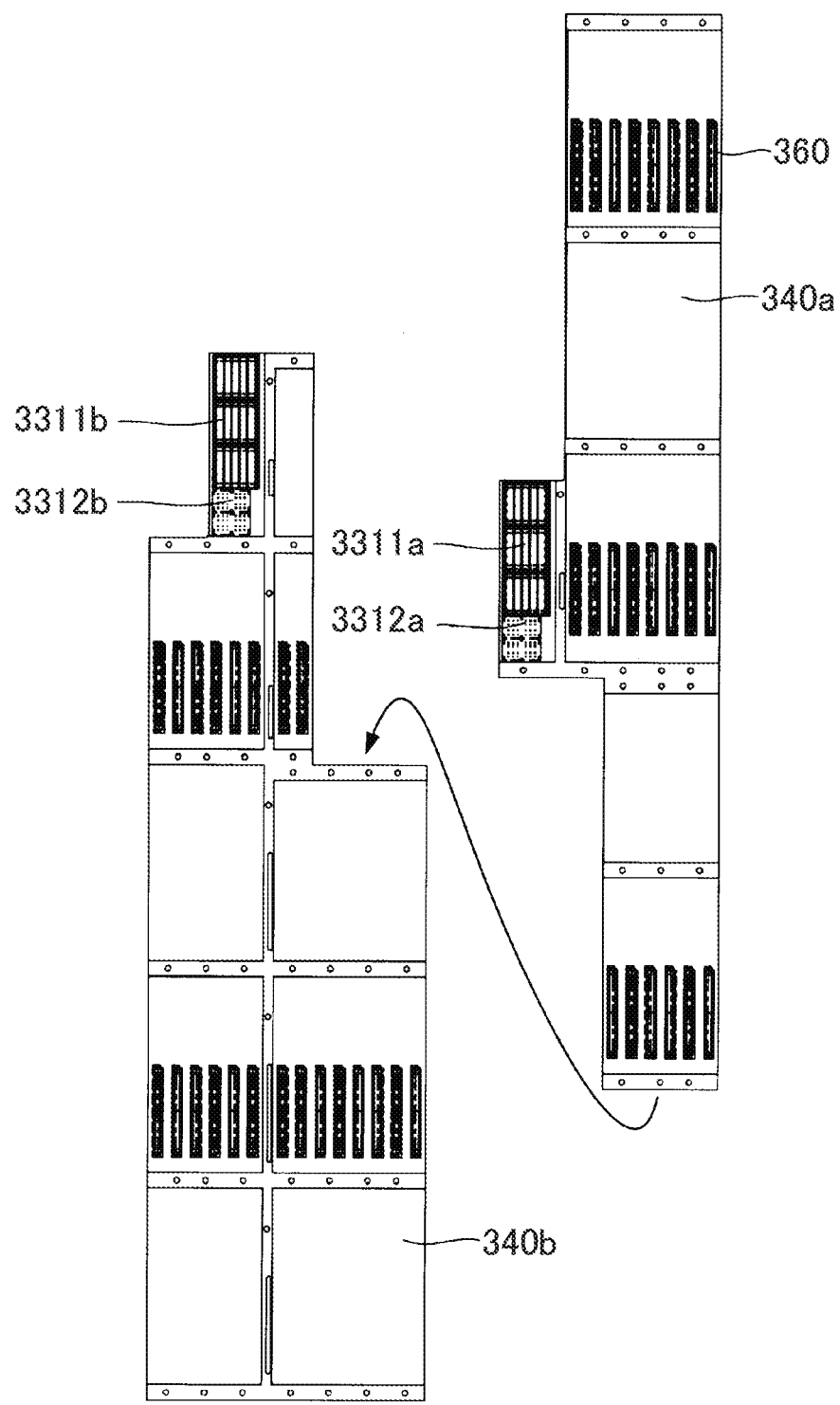
FIG. 9 is a view showing another example of a backplane contained in the electronic device according to another embodiment of the present invention.

FIG. 9 is a view showing another example of the backplane as described above. The backplane is constituted by combining 2 backplane units 340*a*, 340*b* which are arranged in the longitudinal direction of the base board 310. The backplane unit 340*a* includes the signal connector 3311*a* and the power connector 3312*a*, and the backplane unit 340*b* includes the signal connector 3311*b* and the power connector 3312*b* so that the signal connectors 3311*a*, 3311*b*, and the power connectors 3312*a*, 3312*b* are provided separately for each of the backplane units. The above-described structure facilitates simple manufacturing of the backplane while securing its quality, leading to the cost reduction.

The above-described electronic device 300 according to another embodiment ensures configuration of the storage substrate that allows far more flash storage units to be mounted. An explanation will be made referring to FIGS. 10A to 11B as an example that a total of 40 flash storage units, 20 for one surface of the storage substrate, and 20 for the surface opposite the one surface are mounted.

Figure 10A:
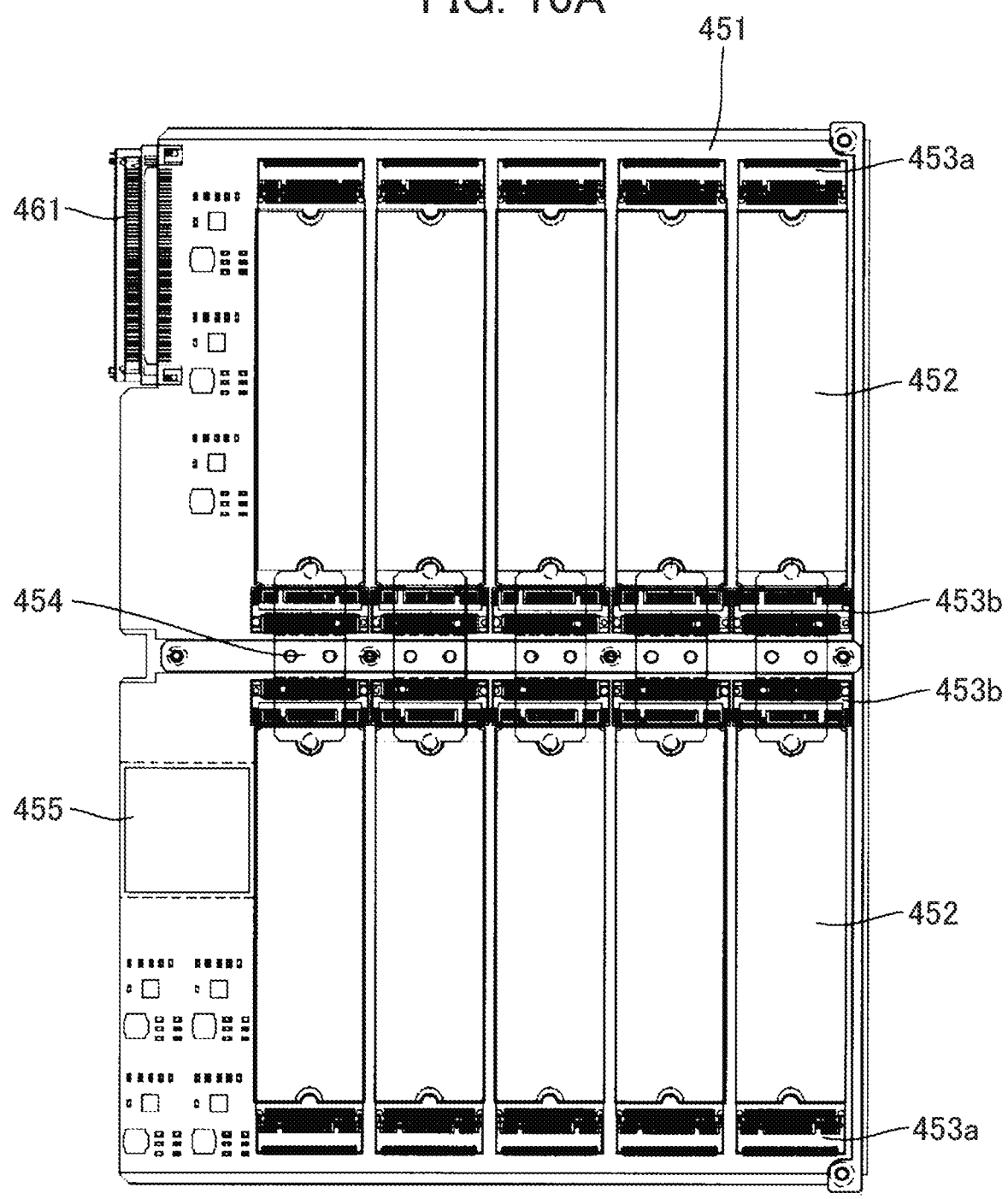
FIG. 10A is a plan view showing another example of a storage substrate contained in the electronic device according to another embodiment of the present invention.
Figure 10B:
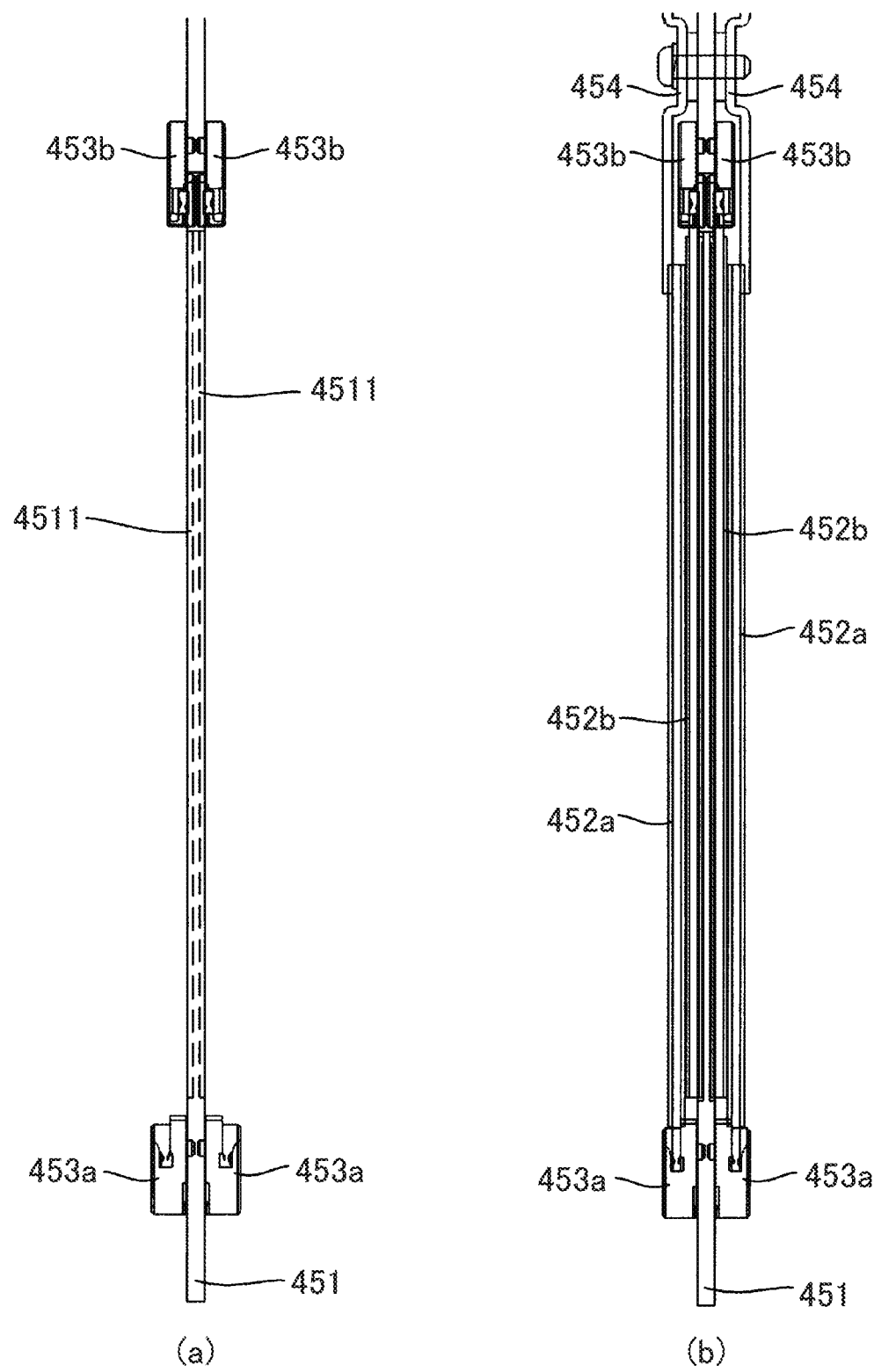
FIG. 10B is a partially enlarged sectional view showing another example of the storage substrate contained in the electronic device according to another embodiment of the present invention.

FIG. 10A is a plan view showing another example of the storage substrate, and FIG. 10B is a partially enlarged sectional view. Referring to FIGS. 10A and 10B, the 20 flash storage units 452 are mounted on one surface of the storage substrate 451, and the 20 flash storage units 452 are mounted on a surface opposite the one surface, respectively so that the 40 flash storage units are mounted on the substrate. Especially in this embodiment, 2 flash storage connectors 453*a*, 453*b* each different in height are disposed on one and opposite surfaces of the storage substrate 451 while facing each other. The electric contact at one end of the flash storage unit 452 is inserted into the 2 flash storage connectors 453*a*, 453*b* each different in height. Then the substrate is configured to arrange 10 flash storage units 452 so as to be adjacent one another in a width or a length direction of the flash storage unit 452 both on 2 surfaces parallel to one surface of the storage substrate 451, and 2 surfaces parallel to the surface opposite the one surface. The storage substrate 451 has a groove 4511 that accommodates a part of the flash storage unit 452 having its end inserted into the low flash storage connector 453*b*. The other end of the flash storage unit 452 having its end inserted into the high flash storage connector 453*a* is fixed with a fastener 454. As a result, the ultra-thin storage substrate 451 may be provided having a total of 40 flash storage units (10 units×2 layers×2) mounted with high density. In addition to the RAID controller (not shown), an expander 455 (for example, SAS expander, SATA expander, PCI express expander) is mounted on the storage substrate 451, which allows connection of the 40 flash storage units.

It is possible to use the M.2 SSD or the mSATA SSD as the flash storage unit, for example, but not limited thereto. It is possible to mount the flash storage unit while having the chip surface exposed, requiring no need of covering with a casing or the like. For example, the use of the SSD of M.2 2280 with thickness of 1.5 mm may realize the card with thickness of 6.9 mm.

Figure 11A:
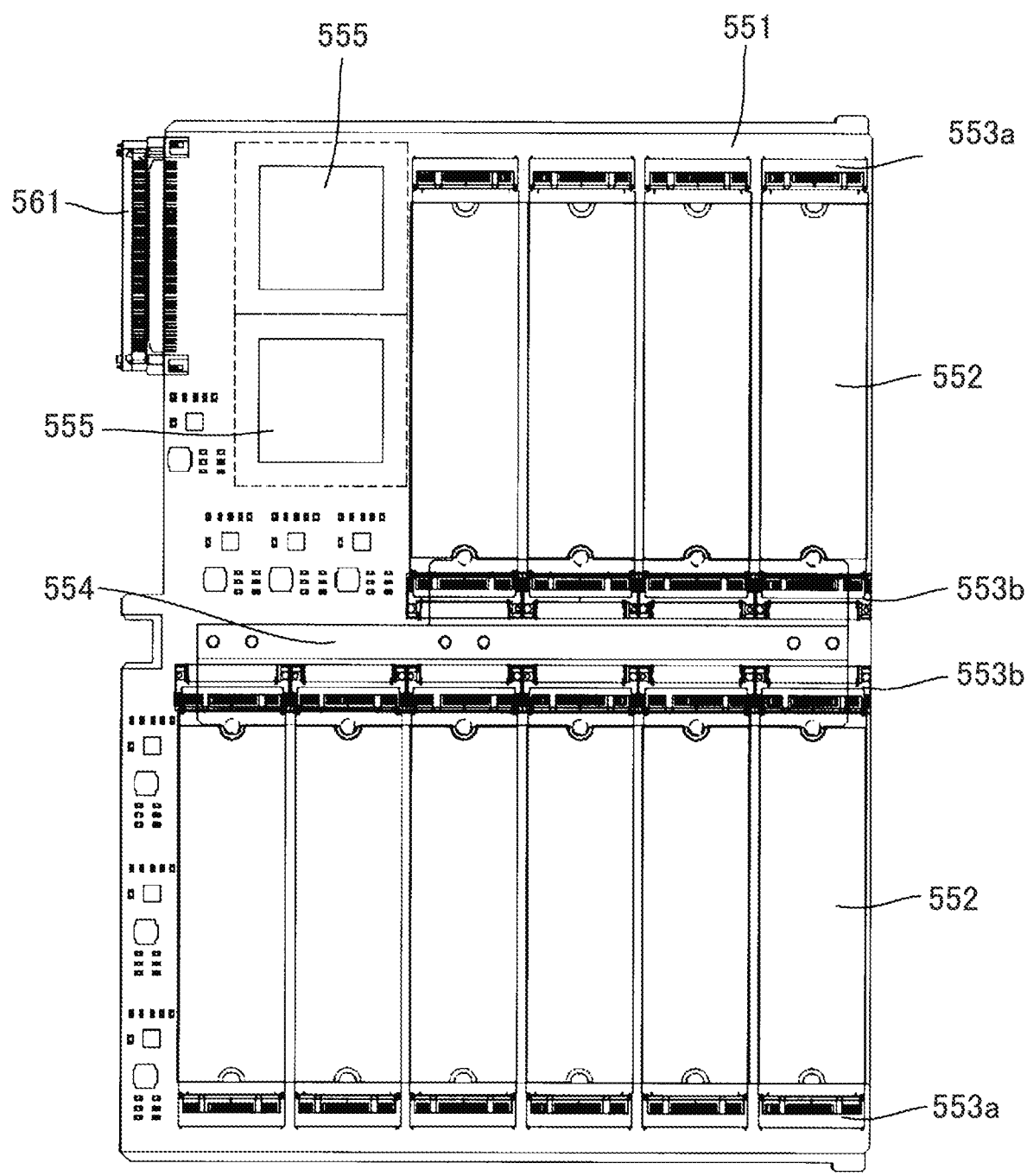
FIG. 11A is a plan view showing another example of the storage substrate contained in the electronic device according to another embodiment of the present invention.
Figure 11B:
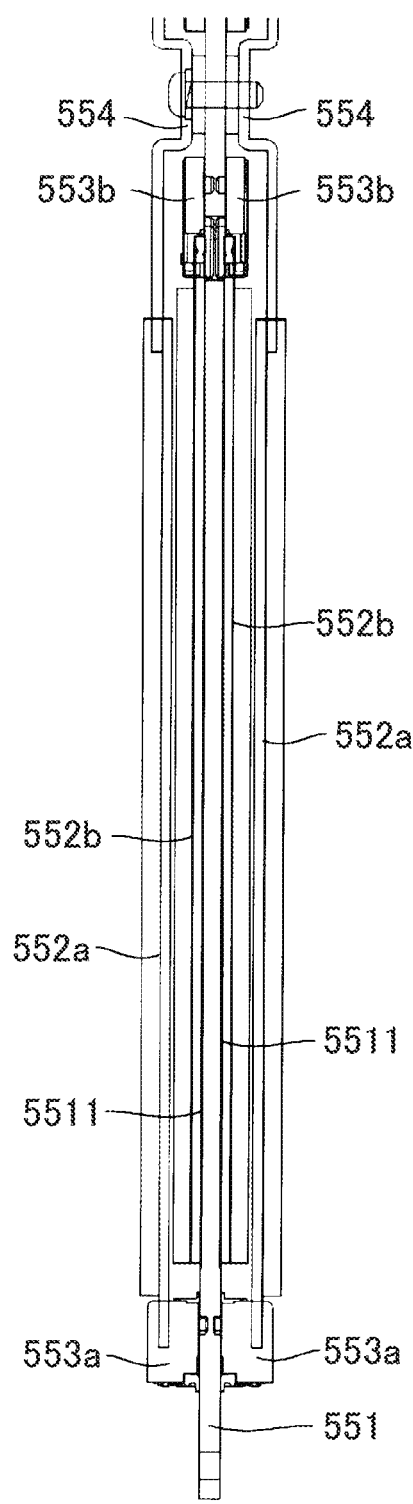
FIG. 11B is a partially enlarged sectional view showing another example of the storage substrate contained in the electronic device according to another embodiment of the present invention.
Figure 12:
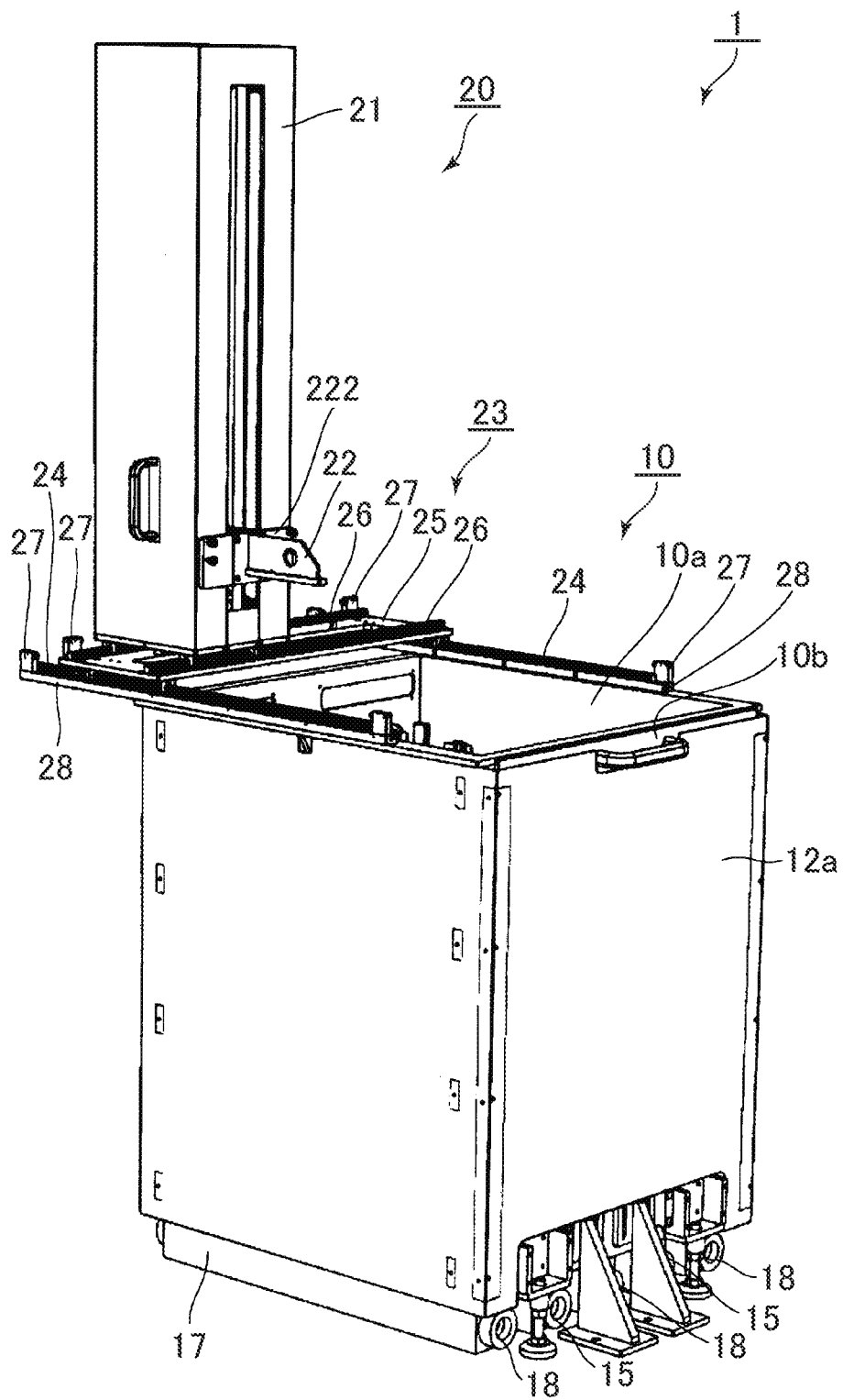
FIG. 12 is a perspective view of an overall structure of a liquid immersion cooling apparatus.
Figure 13:
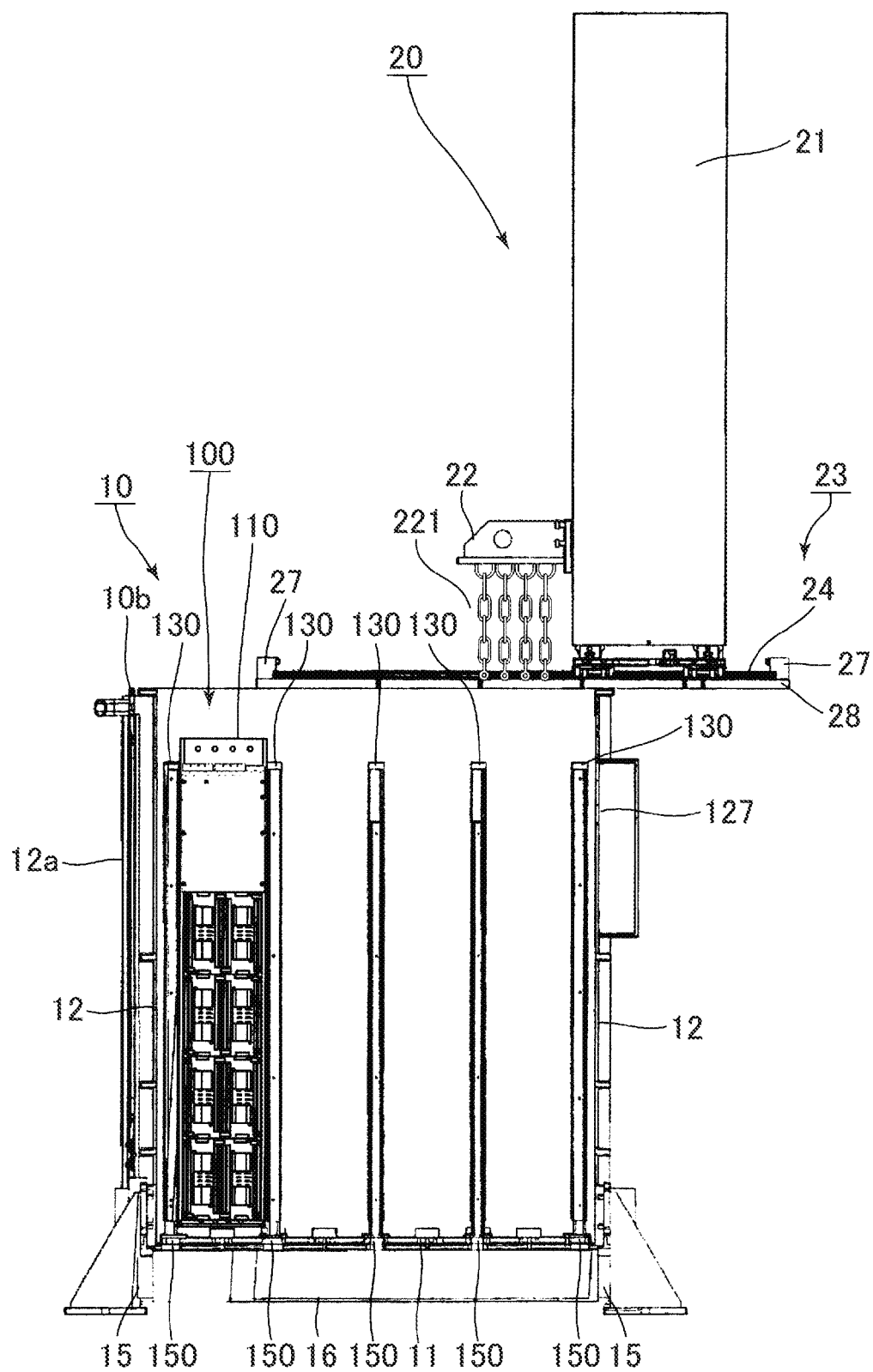
FIG. 13 is a longitudinal sectional view of the liquid immersion cooling apparatus.
Figure 14:
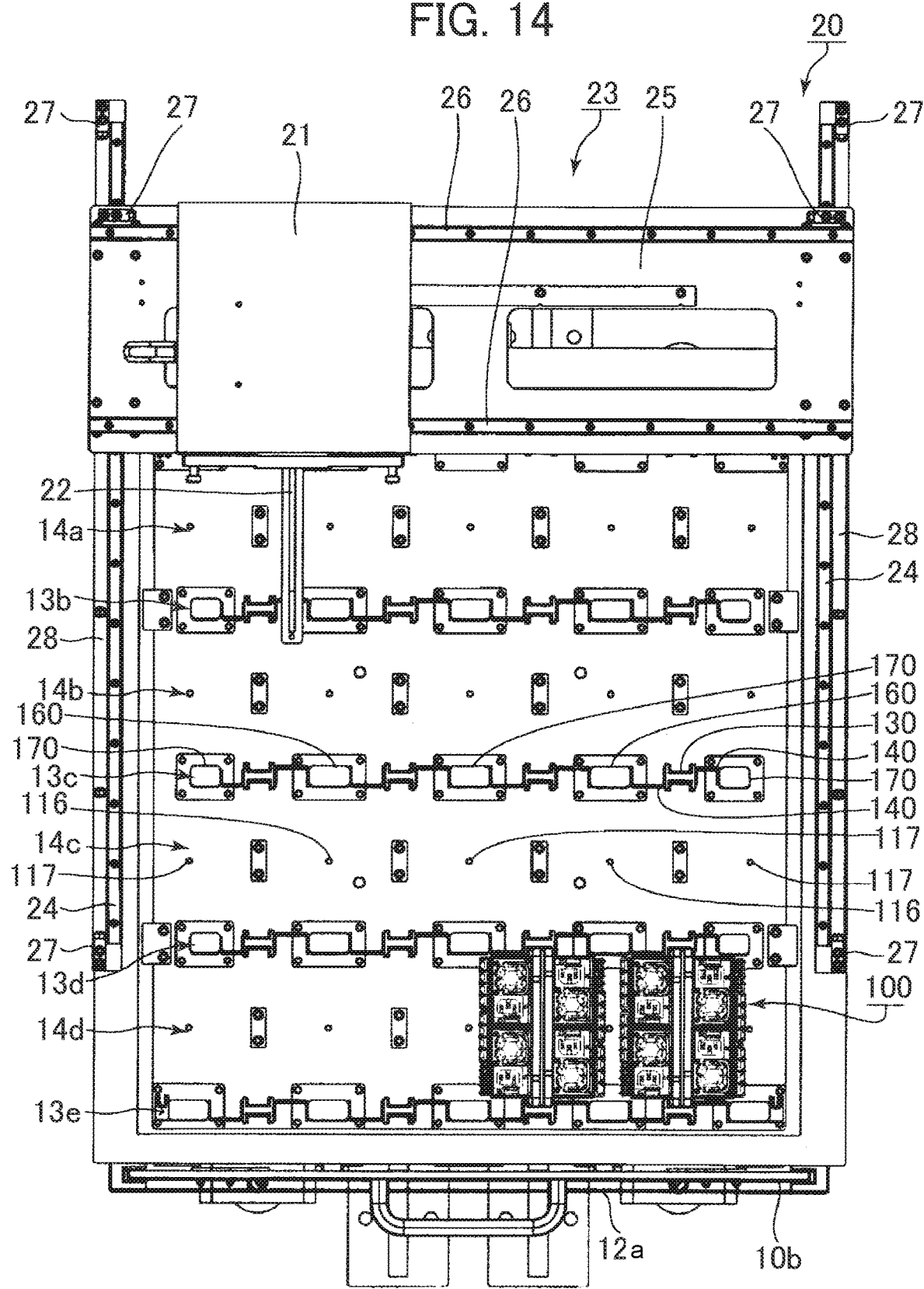
FIG. 14 is a plan view of the liquid immersion cooling apparatus.
Figure 15:
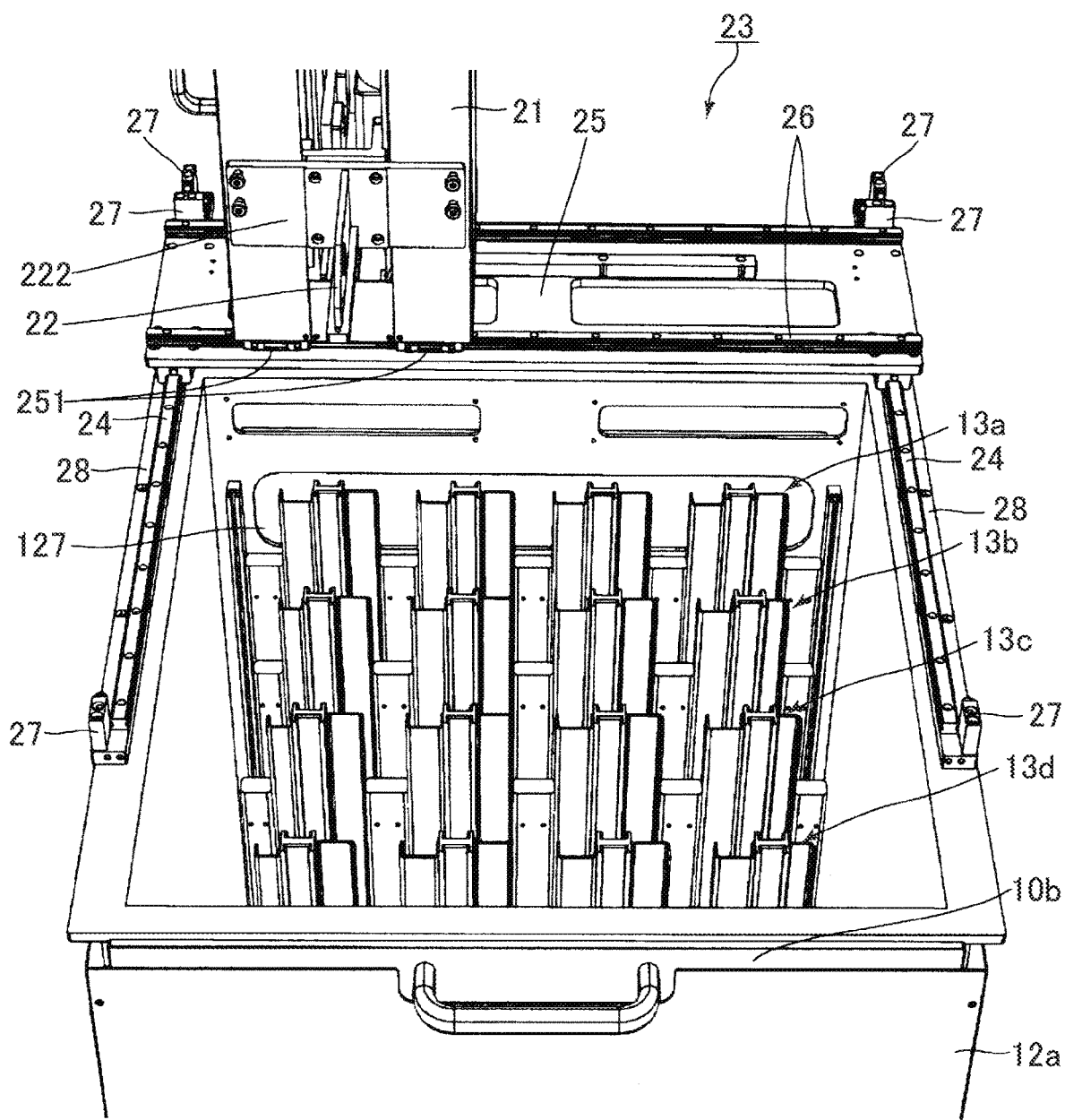
FIG. 15 is a perspective view of a structure of an essential part of the liquid immersion cooling apparatus.
Figure 16:
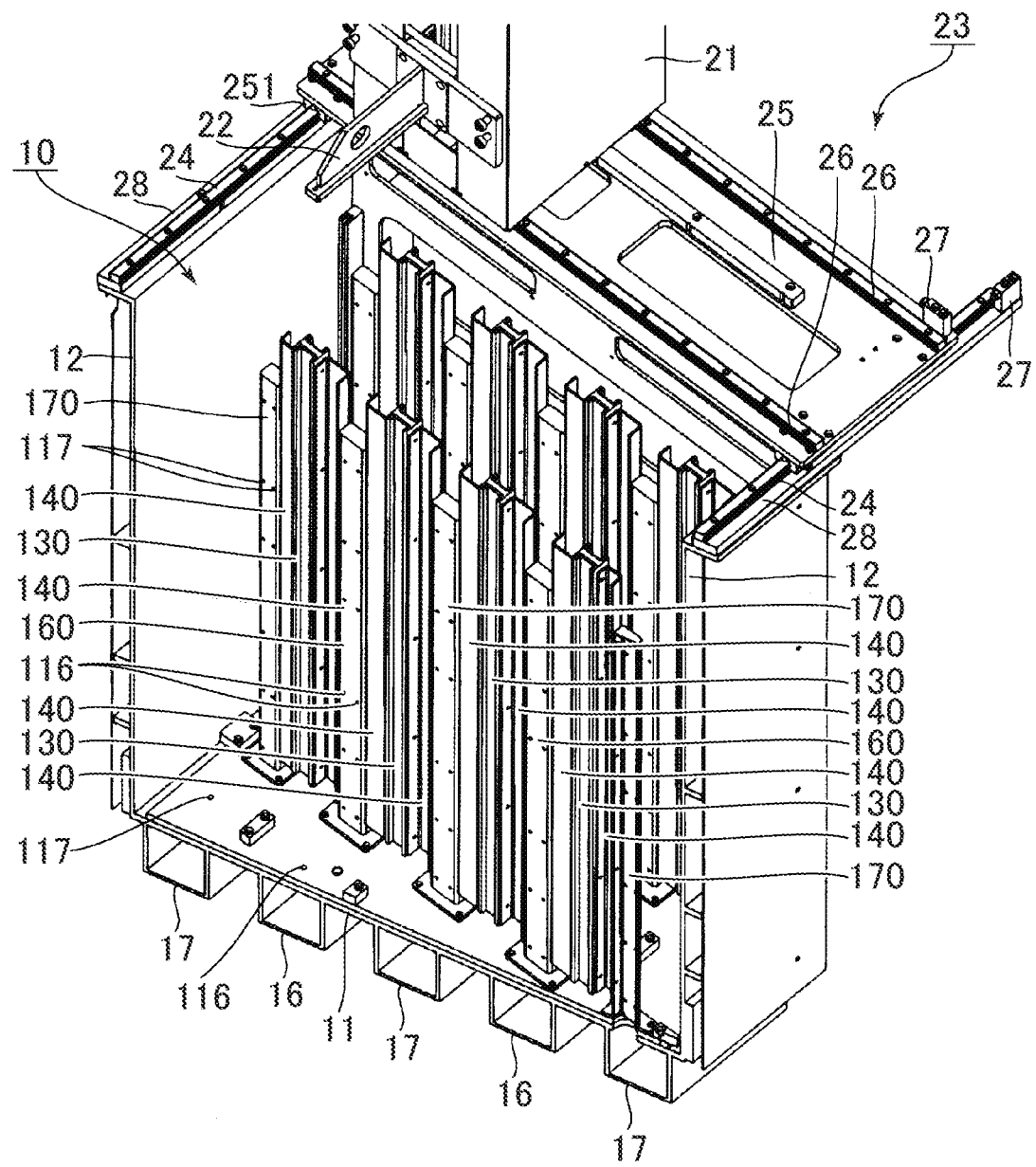
FIG. 16 is a lateral sectional view of a structure of the essential part of the liquid immersion cooling apparatus.
Figure 17:
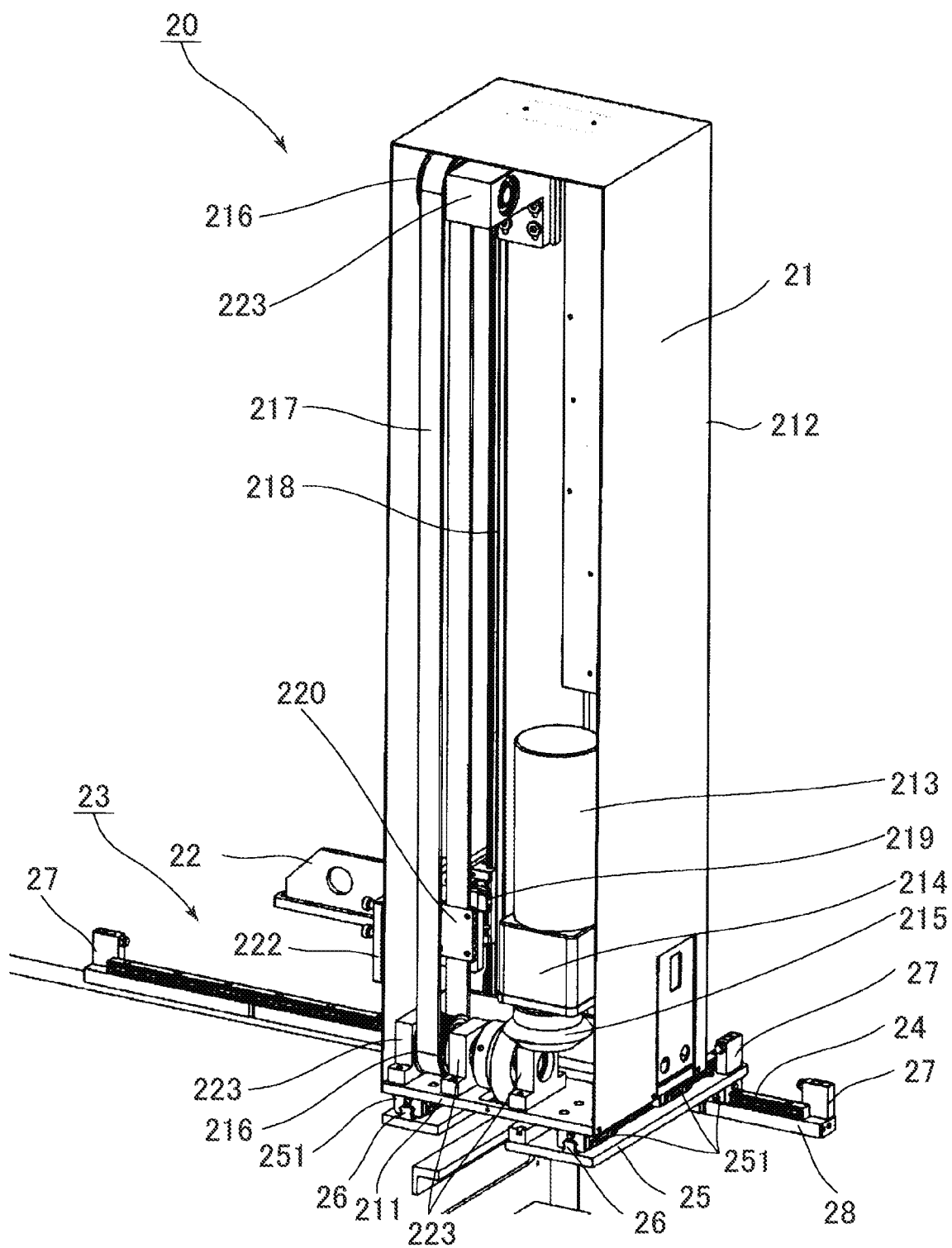
FIG. 17 is a longitudinal sectional view of an example of a lifting mechanism of the liquid immersion cooling apparatus.

FIG. 11A is a plan view of still another example of the storage substrate, and FIG. 11B is a partially enlarged sectional view. Referring to FIGS. 11A and 11B, 20 flash storage units 552 are mounted on one surface of the storage substrate 551, and 20 flash storage units 552 are mounted on a surface opposite the one surface so that a total of 40 flash storage units are mounted on the substrate. In this embodiment, likewise the example shown in FIGS. 10A and 10B, 2 flash storage connectors 553*a*, 553*b* each different in height are disposed on one and opposite surfaces of the storage substrate 551 while facing each other. The electric contact at one end of the flash storage unit 552 is inserted into the 2 flash storage connectors 553*a*, 553*b* each different in height. The substrate is configured to arrange the 10 flash storage units 552 so as to be adjacent one another in the width or the length direction of the flash storage unit 552 both on 2 surfaces parallel to one surface of the storage substrate 551, and 2 surfaces parallel to the surface opposite the one surface. The storage substrate 551 has a groove 5511 that accommodates a part of the flash storage unit 552 having its end inserted into the low flash storage connector 553*b*. The other end of the flash storage unit 452 having its end inserted into the high flash storage connector 553*a* is fixed with a fastener 554. As a result, the ultra-thin storage substrate 551 may be provided having a total of 40 flash storage units (10 units×2 layers×2) mounted with high density. In addition to the RAID controller (not shown), an expander 555 (for example, SAS expander, SATA expander, PCI express expander) is mounted on the storage substrate 551, which allows connection of the 40 flash storage units.

Detailed explanation will be made with respect to preferred embodiments of the liquid immersion cooling apparatus configured to immerse the electronic device 100 according to the embodiment of the above-described invention, or the electronic device 300 according to another embodiment in the coolant for direct cooling in reference to the drawings. The following explanation relates to the high density liquid immersion cooling apparatus configured to house total of 16 units of the electronic devices 100 in the divided housing parts of the cooling tank so as to be cooled. The above explanation is made only for illustrative purpose, and an arbitrary number of the electronic devices may be housed in the high density liquid immersion cooling apparatus without limiting the structure of the electronic device to which the present invention is applied. As described below, the housing parts in the cooling tank may be configured to house not only the electronic devices of single type, but also those of different type, for example, the electronic devices 100 and 300.

Referring to FIGS. 12 to 17, a liquid immersion cooling apparatus 1 according to an embodiment includes a cooling tank 10. An open space 10*a* is defined by a bottom wall 11 and side walls 12 of the cooling tank 10. Inner partitions 13*a*, 13*b*, 13*c*, 13*d*, 13*e* are laterally disposed in the cooling tank 10 so as to equally divide the open space 10*a* into 4 arrayed housing parts 14*a*, 14*b*, 14*c*, 14*d*. In the embodiment, 4 units of a vertically long electronic device 100 having the width approximately ¼ of the longitudinal length of the open space 10*a* of the cooling tank 10 are housed in each of the housing parts 14*a*, 14*b*, 14*c*, 14*d*. That is, a total of 16 units of the electronic device may be housed with high density.

A casing 12*a* is provided around the outer periphery of the side walls 12 of the cooling tank 10. The space is formed between the side wall 12 at the front side of the cooling tank 10 and the casing 12*a*. A top plate 10*b* for closing the open space 10*a* of the cooling tank 10 may be housed in the space. Upon maintenance work for the liquid immersion cooling apparatus 1, the top plate 10*b* is kept housed in the space. Upon operation of the liquid immersion cooling apparatus 1, the top plate 10*b* is taken out from the space to cover the opening of the cooling tank 10 so that the open space 10*a* is closed.

The coolant (not shown) is filled in the cooling tank 10 up to the liquid surface (not shown) sufficient to immerse the entire body of the electronic device 100. It is preferable to use a fluorine based inert liquid formed of the complete fluoride well known as "Fluorinert (trademark of 3M) FC-72" (boiling point: 56° C.), "Fluorinert FC-770" (boiling point: 95° C.), "Fluorinert FC-3283" (boiling point 128° C.), "Fluorinert FC-40" (boiling point: 155° C.), "Fluorinert FC-43" (boiling point: 174° C.), all of which are products of 3M. However, the arbitrary coolant may be used in a nonrestrictive way. The use of Fluorinert FC-40 and Fluorinert FC-43 each having the boiling point higher than 150° C., which hardly evaporates is advantageous for keeping the liquid level height in the cooling tank 10 for a long period of time.

Disposed below the bottom wall 11 of the cooling tank 10 are a plurality of inflow headers 16 each having inlets 15 for the coolant at both ends, and a plurality of outflow headers 17 each having outlets 18 for the coolant at both ends. Those inflow headers 16 and the outflow headers 17 are alternately arranged in the lateral direction with respect to the bottom wall 11 of the cooling tank 10.

Each of the inner partitions 13*a*, 13*b*, 13*c*, 13*d*, 13*e* includes a plurality of inflow pipes 160, and a plurality of outflow pipes 170 both penetrating through the bottom wall 11 via bottom openings 150, and extending to the level around the liquid surface of the coolant, and a plurality of board retainers 130 for retaining an edge of the base board 110 of the electronic device 100. In the embodiment, the inflow pipes 160 and the outflow pipes 170 are alternately disposed via support spacers 140 at left and right sides of the board retainers 130 each having one end fixed to the bottom wall 11. In each of the housing parts 14*a*, 14*b*, 14*c*, 14*d*, a recess part formed by a pair of board retainers 130 longitudinally facing each other in the cooling tank 10 is designed to mechanically hold the edge of the base board 110 of the electronic device 100 at both sides. For the mechanical holding operation, it is possible to attach a rod-like support to the edge of the base board 110 so as to be fit with the width of the recess part formed in the board retainers 130.

Each of the inflow pipe 160 and the outflow pipe 170 has a rectangular cross section, for example. The inflow pipe 160 has a plurality of small holes as inflow openings 116 along the longitudinal direction of the inflow pipe 160. Likewise, the outflow pipe 170 has a plurality of small holes as outflow openings 117 along the longitudinal direction of the outflow pipe 170. The inflow openings 116 are formed in front and back surfaces of the inflow pipe 160. Likewise, the outflow openings 117 are formed in front and back surfaces of the outflow pipe 170.

Additionally, a plurality of small holes piercing through the bottom wall 11 are formed in bottom parts of the housing parts 14*a*, 14*b*, 14*c*, 14*d* as additional inflow openings 116 and outflow openings 117, respectively. Another outflow opening 127 is formed in the upper portion of the side wall 12 at the back side of the cooling tank 10. The outflow opening 127 formed in the side wall 12 at the back side corresponds to the outflow opening formed in the part around the liquid surface of the coolant.

In the embodiment, the circulation of the coolant when using the liquid immersion cooling apparatus 1 will be briefly described. The cold coolant which has been supplied from the inlets 15 at both ends to the inflow header 16 is partially discharged from the inflow openings 116 formed in the respective bottom parts of the housing parts 14*a*, 14*b*, 14*c*, 14*d*. The remaining coolant is supplied into the inflow pipes 160 through the bottom openings 150. The coolant supplied into the inflow pipes 160 is discharged from the inflow openings 116 formed in the inflow pipes 160.

The coolant warmed by heat taken from the electronic devices 100 housed in the housing parts 14*a*, 14*b*, 14*c*, 14*d* passes through the outflow opening 127 formed in the side wall 12 at the back side of the cooling tank 10 at the height near the liquid surface, and flows out from the cooling tank 10. The warmed coolant is partially drawn into the outflow headers 17 from the outflow openings 117 formed in the bottom parts of the housing parts 14*a*, 14*b*, 14*c*, 14*d*. At the same time, the coolant passes through the outflow openings 117 formed in the outflow pipe 170, and the bottom openings 150 so as to be drawn into the outflow headers 17. The coolant drawn into the outflow headers 17 flows out from the cooling tank 10 while passing through the outlets 18.

The inflow openings 116 for the coolant are formed in the bottom parts or the side surfaces of the respective housing parts 14*a*, 14*b*, 14*c*, 14*d*, and the outflow opening 127 is formed around the liquid surface of the coolant. The above-described structure prevents stagnation of the coolant which has been warmed by the highly densely housed electronic devices 100 in the respective housing parts 14a, 14b, 14c, 14d so that the cooling efficiency is improved. The structure having the inflow pipe 160 with the inflow openings 116 and the outflow pipe 170 with the outflow openings 117 disposed at the left and right sides of each of the board retainers 130 alternately via the support spacers 140 is especially advantageous because of further enhanced effect of preventing the coolant stagnation.

Referring to the drawing, the detailed explanation will be made with respect to a lifting mechanism configured to lift and lower the vertically long electronic devices 100 which are highly densely housed in the cooling tank 10 from/into the housing parts 14a, 14b, 14c, 14d, respectively.

A lifting mechanism 20 includes an arm 22 configured to lift the electronic devices 100 from the housing parts 14a, 14b, 14c, 14d, and lower them into the housing parts 14a, 14b, 14c, 14d. The lifting mechanism 20 includes a tower 21 equipped with a guide 218 and a motive power source 213 for raising and lowering the arm 22, and a slide mechanism 23 attached to the cooling tank 10 for movably supporting the tower 21 relative to the cooling tank 10 in a horizontal plane located above the open space 10a. As the slide mechanism 23 is directly attached to the cooling tank 10, the stage does not have to be provided in the periphery of the installation surface of the cooling tank 10. The guide 218 and the motive power source 213 of the tower 21 allow the arm 22 to move up and down. This makes it possible to safely lift or lower the electronic devices housed with high density in the cooling tank without vibrating the arm forward, backward, leftward, and rightward during the lifting operation.

In the embodiment, the tower 21 includes a reducer 214 for reducing the rotating speed of a shaft of the motive power source 213 such as the servo motor, a gear 215 for converting the rotary motion of the shaft of the reducer 214 into the rotary motion of the shaft orthogonal to the shaft of the reducer 214, a pair of timing pulleys 216, and a timing belt 217. One of brackets 222 of the arm 22 is movably supported at the guide 218 disposed in the vertical direction (Z direction) via a guide roller 219. The other bracket 222 of the arm 22 is fixed to the timing belt 217 through a belt holder 220. The shaft of the gear 215 and the shaft of the timing pulley 216 are rotatably supported with bearing holders 223.

In the embodiment, the slide mechanism 23 includes a pair of longitudinal rails 24 disposed on top ends of the pair of side walls 12 positioned in the width direction of the cooling tank 10, a movable base 25 movably supported on the pair of longitudinal rails 24, and a pair of lateral rails 26 disposed on the movable base 25. The tower 21 is movably supported on the pair of lateral rails 26. Specifically, a plurality of guide rollers 251 attached to the lower part of the movable base 25 slide on the pair of longitudinal rails 24 so as to allow the longitudinal movement (Y direction) of the tower 21. The guide rollers 251 attached to a fixation base 211 at the bottom part of the tower 21 slide on the pair of lateral rails 26 to allow the lateral movement (X direction) of the tower 21.

Referring to the example shown in the drawing, a pair of supports 28 are used for placing the pair of longitudinal rails 24 on the top ends of the side walls 12 of the cooling tank 10. The support 28 is fixed to the top end of the side wall 12 so that one end of the support 28 projects rearward of the cooling tank 10 by the length substantially equal to the longitudinal length of the tower 21. The pair of longitudinal rails 24 are disposed on the thus projected pair of supports 28. Then the pair of longitudinal rails 24 have running ranges where the movable bases 25 are located rearwardly apart from the upper part of the open space 10a of the cooling tank 10 for allowing the electronic device 100 to be lifted from the housing part 14a that is the closest to the side wall 12 at the back surface side of the cooling tank 10, and to be lowered into the housing part 14a. The pair of supports 28 and the pair of longitudinal rails 24 are disposed so as to be located outside the width of the top plate 10b when it is disposed to cover the opening of the cooling tank 10. The above-described structure is designed so that those supports 28 and the longitudinal rails 24 do not interfere with covering of the open space 10a by the top plate 10b.

Stoppers 27 disposed near both ends of the pair of longitudinal rails 24 serve to restrict the range in which the tower 21 moves in the longitudinal direction (Y direction) of the cooling tank 10 in a horizontal plane located above the open space 10a. The stoppers 27 disposed near both ends of the pair of lateral rails 26 serve to restrict the movement of the tower 21 so that the range in which the tower 21 moves in the width direction (X direction) of the cooling tank 10 does not substantially exceed at least the width of the open space 10a. This ensures to prevent the fixation base 211 or a housing 212 of the tower 21 from extending over the width of the cooling tank 10 upon movement of the tower 21 in the width direction of the cooling tank 10. Although the plurality of liquid immersion cooling apparatuses are densely arranged, the above-described structure may prevent the interference between operation ranges of the lifting mechanisms of the adjacent liquid immersion cooling apparatuses.

The operation of the above-structured lifting mechanism 20 will be described. The tower 21 is horizontally moved with a handle at the side of the tower 21, and stopped at the position where the arm 22 is located just above the base board 110 of the electronic device 100 to be lifted. A controller (not shown) is operated to drive the motive power source 213 of the tower 21 so that the rotation of the shaft of the motive power source 213 is transferred to the timing pulley 216 via the gear 215 to lower the arm 22 to the lowermost part. In this state, tips of a pair of suspension fittings 221 attached to the lower part of the arm 22 are connected to a pair of holes formed in the top end of the base board 110 of the electronic device 100. Then the controller (not shown) is operated to transfer the reverse rotation of the shaft of the motive power source 213 of the tower 21 to the timing pulley 216 for lifting the arm 22. The electronic device 100 which is suspended with the arm 22 by the suspension fittings 221 is then lifted while having the base board 110 sliding in the board retainer 130. Upon raising of the arm 22 to the uppermost part, the electronic device 100 is brought into the suspended state while being completely taken out from the board retainers 130 of the housing part 14a, 14b, 14c, or 14d. In the above-described state, the tower 21 may be horizontally moved to carry out the maintenance work for the electronic device 100 as needed. After finishing the maintenance work, the controller (not shown) is operated again to lower the electronic device 100 into the housing part 14a, 14b, 14c, or 14d so as to be returned to the original position.

Meanwhile, the controller (not shown) is operated to stop driving the motive power source 213 of the tower 21 in the process of lifting or lowering the arm 22 so that the arm 22 is made stationary at the arbitrary height in the vertical direction of the tower 21. The electronic device 100 is suspended at the desired height while being held partially in the board retainer 130 of the housing part 14a, 14b, 14c, or 14$d$ without being completely taken out therefrom. In the above-described state, it is possible to carry out the maintenance work for the electronic device 100. In the state where the electronic device 100 is suspended as well as in the stationary state at the arbitrary height in the direction vertical to the tower 21, the reducer 214 helps in preventing the downward load applied to the arm 22 from causing unintentional rotation of the shafts of the timing pulley 216 and the motive power source 213.

In the above embodiment, an example of the single cooling tank has been explained. However, it is possible to employ a plurality of cooling tanks adjacently arranged in the lateral direction. In this case, at least one lifting mechanism may be shared by the adjacently disposed cooling tanks. Specifically, the at least one lifting mechanism may be configured to include the tower having the guide and the motive power source for raising and lowering the arm, the slide mechanism which is attached to the adjacent cooling tank for movably supporting the tower relative to the adjacent cooling tank in a horizontal plane located above the open space, and the stoppers for restricting movement of the tower so that the tower movement range in the width direction of the adjacent cooling tank does not substantially exceed the distance between the side walls separated farthest in the lateral direction among those for forming the open space between the adjacent cooling tanks.

In the case of the cooling tanks adjacently arranged in the lateral direction, it is preferable that the slide mechanism includes the pair of longitudinal rails disposed on top ends of the pair of side walls located in the width direction of the respective cooling tanks, the movable bases movably supported on the pair of longitudinal rails, and the pair of lateral rails disposed on the movable bases. Preferably, the tower is movably supported on the pair of lateral rails. The width of the movable base may be substantially the same as that of the single cooling tank, or the same as the overall width of the adjacently arranged cooling tanks. If the movable base has the width substantially the same as that of the single cooling tank, the pair of lateral rails for one of the adjacent cooling tanks may be linked to the pair of lateral rails for the other cooling tank using the appropriate linkage member. This makes it possible to move the tower on one pair of lateral rails onto the other pair of lateral rails so that the single tower is shared by the adjacently arranged cooling tanks. If the movable base has the width substantially the same as the overall width of the plurality of adjacently arranged cooling tanks, the length of the pair of lateral rails may be set to the overall width of the adjacently arranged cooling tanks. Therefore, the linkage member for linking the pairs of lateral rails is not required.

In the above embodiment, the manual movement of the tower 21 in the horizontal plane has been explained as an example. It is possible to add a motive power source for running the movable base 25 on the longitudinal rail 24, and another motive power source for running the tower 21 including the fixation base 211 on the lateral rail 26 to the lifting mechanism so as to move the tower 21 by operating the controller (not shown). It is possible to employ the electric motive power source such as the servo motor for those additional motive power sources.

In the case of movement of the tower 21 in the horizontal plane by adding the electric motive power sources, it is possible to replace the mechanical stoppers 27 as shown in the drawing for physically interrupting the movement of the tower 21 with the movement restriction mechanism through software. In the specification, the stopper may include both the mechanical stopper and the movement restriction mechanism through software.

The liquid immersion cooling apparatus according to the embodiment ensures to safely lift or lower the electronic device housed in the cooling tank with high density without requiring the stage in the periphery of the installation surface of the cooling tank. Additionally, dense arrangement of a plurality of liquid immersion cooling apparatuses allows prevention of mutual interference between the movement ranges of the lifting mechanisms of adjacent liquid immersion cooling apparatuses.

Figure 18:
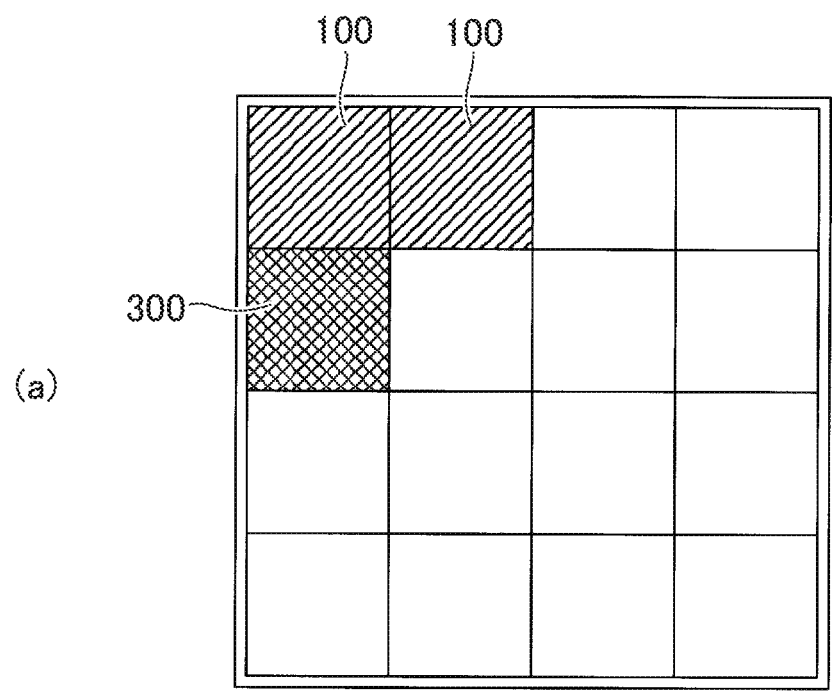
FIG. 18 is a view schematically showing a structure of a cooling system.
Figure 18:
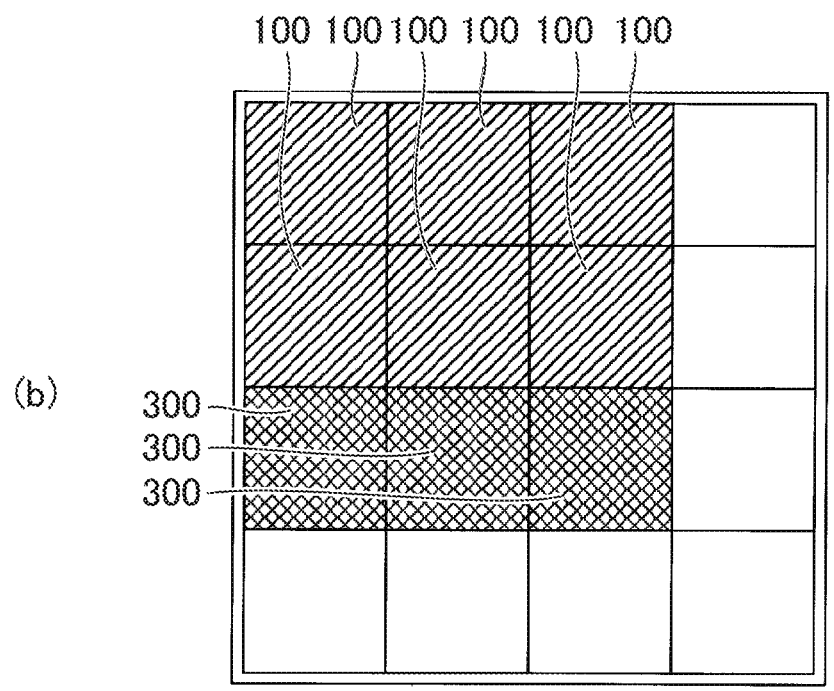

As described above, in the embodiment, it is possible to house a plurality of different types of electronic devices including the electronic devices 100 and 300, for example, in the plurality of housing parts in the cooling tank without being limited to the case where the electronic devices of the single type are housed. In other words, a plurality of different types of electronic devices include one or more first electronic devices each configured to mainly execute arithmetic operations through a plurality of processors, and one or more second electronic devices each configured to mainly store data through a plurality of storage units. One or more arbitrary numbers of the first electronic devices and one or more arbitrary numbers of the second electronic devices are housed in the respective housing parts of the cooling apparatus separately so that the cooling system constitutes the computer with desired calculation capacity and desired storage capacity. Referring to the schematic view in FIG. 18, specifically, FIG. 18($a$), 2 units of the electronic device 100 and 1 unit of the electronic device 300 may be housed in 3 of 16 housing parts of the liquid immersion cooling apparatus 1 to constitute the computer. Referring to FIG. 18($b$), 6 units of the electronic device 100 and 3 units of the electronic device 300 may be housed in 9 housing parts to constitute the computer. The electronic device 100 corresponds to the first electronic device in which the arithmetic operation is mainly executed by the processors. The electronic device 300 corresponds to the second electronic device in which data storage is mainly executed by the storage units.

As described above, arbitrary combination of the first and the second electronic devices ensures to constitute the computer with desired calculation capacity and desired storage capacity. Therefore, it is possible to provide the configurable cooling system.

INDUSTRIAL APPLICABILITY

The present invention is widely applicable to electronic devices mounted with ultra-high density for liquid immersion cooling.

REFERENCE SIGNS LIST

1: liquid immersion cooling apparatus,
10: cooling tank,
10$a$: open space,
10$b$: top plate,
11: bottom wall,
12: side wall,
12$a$: casing,
100, 300: electronic device,
110, 310: base board,
111: suspension fitting hole,
112: flow channel,
120, 320: substrate group 121, 321: first circuit board,
122, 322: second circuit board,
123, 323: third circuit board,
124a, 124b, 124c, 124d: processor,
125: main memory,
126a, 126b, 126c, 126d: socket,
127a, 127b, 127c, 127d: voltage conversion circuit,
128, 138: spacer,
129, 139: screw,
130: board retainer,
131: first connector,
132, 332: second connector,
133, 333: third connector,
134: slot,
135, 335: power unit,
136, 336: network cable socket,
137: bottom hole,
140: support spacer,
13a, 13b, 13c, 13d, 13e: inner partition,
14a, 14b, 14c, 14d: housing part,
15: inlet,
150: bottom opening,
16: inflow header,
116: inflow opening,
160: inflow pipe,
17: outflow header,
117, 127: outflow opening,
170: outflow pipe,
18: outlet,
20: lifting mechanism,
21: tower,
211: fixation base,
212: housing,
213: motive power source,
214: reducer,
215: gear,
216: timing pulley,
217: timing belt,
218: guide,
219: guide roller,
220: belt holder,
22: arm,
221: suspension fitting,
222: bracket,
223: bearing holder,
23: slide mechanism,
24: longitudinal rail (Y direction),
25: movable base,
251: guide roller,
26: lateral rail (X direction),
27: stopper,
28: support,
311: primary member,
312: secondary member,
313: cut,
314: pawl,
315, 316: support plate,
3311a, 3311b: signal connector,
3312a, 3312b: power connector,
340: backplane,
340a, 340b: backplane unit,
341: slit,
351, 451, 551: storage substrate,
352, 452, 452a, 452b, 552, 552a, 552b: flash storage unit,
353: flash storage connector,
354, 454, 554: fastener,
355, 455, 555: expander,
360: storage connector,
361, 461, 561: storage connector plug,
4511, 5511: groove,
453a, 553a: flash storage connector (high),
453b, 553b: flash storage connector (low)

The invention claimed is:

1. A cooling apparatus including an electronic device that is immersed in a liquid coolant filled in a liquid immersion cooling apparatus, and directly cooled, the electronic device being configured to be housed in a housing part of the liquid immersion cooling apparatus, the electronic device comprising:
a base board;
a plurality of storage substrates to be arranged on at least one surface of the base board; a backplane including a plurality of connectors for electric connection of the respective storage substrates, the backplane being mounted orthogonally onto the one surface of the base board;
a plurality of support plates that support the plurality of storage substrates, the plurality of support plates being fixed to the base board and the backplane; and
a plurality of flash storage units mounted on the respective storage substrates, wherein:
the backplane includes a combination of a plurality of backplane units arranged in a length direction of the base board, each of the backplane units including a signal connector and a power connector, the signal connector and the power connector being disposed separately for each of the backplane units, and
the flash storage units are arranged on a surface parallel to at least one surface of each of the storage substrates so as to be adjacent one another in a width or a length direction, or in both the width and the length directions of the flash storage unit;
wherein the liquid immersion cooling apparatus includes a cooling tank with an open space defined by a bottom wall and side walls, arranged housing parts formed by dividing the open space using a plurality of internal partition walls in the cooling tank, and an inflow opening and an outflow opening for the liquid coolant, the inflow opening being formed in a bottom part or a side surface of each of the housing parts, and the outflow opening being formed around a surface of the liquid coolant circulating in the respective housing parts.

2. The electronic device according to claim 1, wherein the flash storage unit is an M.2 SSD or an mSATA SSD.

3. The electronic device according to claim 1, wherein:
a plurality of flash storage connectors are arranged on the one surface of the storage substrate, and
each electric contact of the flash storage units is inserted into each of the flash storage connectors.

4. The electronic device according to claim 1, wherein:
the base board includes a primary member and a secondary member;
the primary member includes a plurality of cuts each formed in a width direction for fixing a plurality of support plates that support the storage substrates to the primary member;
the secondary member includes a plurality of pawls which are inserted into a plurality of slits formed in the backplane, respectively, and fixed to the primary member; and
the support plates include holes for passage of the coolant.

5. The electronic device according to claim 1, wherein:
the storage substrates are further arranged on a surface opposite the one surface of the base board;

the backplane further includes a plurality of connectors for electric connection of the storage substrates arranged on the surface opposite the one surface of the base board; and an external shape of a connected body formed by attaching the storage substrates and the backplane to the base board is similar to an internal shape of the housing part.

6. The electronic device according to claim 5, wherein the external shape of the connected body is a rectangular parallelepiped.

* * * * *